US008101438B2

(12) United States Patent
McAvoy et al.

(10) Patent No.: US 8,101,438 B2

(45) Date of Patent: Jan. 24, 2012

(54) METHOD OF FABRICATING PRINTHEAD INTEGRATED CIRCUIT WITH BACKSIDE ELECTRICAL CONNECTIONS

(75) Inventors: Gregory John McAvoy, Balmain (AU); Rónán Pádraig Seán O'Reilly, Balmain (AU); David McLeod Johnstone, Balmain (AU); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 360 days.

(21) Appl. No.: 12/509,491

(22) Filed: Jul. 27, 2009

(65) Prior Publication Data

US 2011/0020965 A1 Jan. 27, 2011

(51) Int. Cl.
*H01L 21/30* (2006.01)

(52) U.S. Cl. ..................... 438/21; 257/E21.211; 216/27

(58) Field of Classification Search ........................ None
See application file for complete search history.

(56) References Cited

U.S. PATENT DOCUMENTS 6,322,203 B1 * 11/2001 Kitahara ......................... 347/70
6,987,312 B2 * 1/2006 Theuss .......................... 257/680
7,108,354 B2 * 9/2006 Gulvin et al. ................... 347/55
7,305,764 B2 * 12/2007 Kitahara ...................... 29/890.1
7,357,491 B2 * 4/2008 Kojima ........................... 347/68
7,867,407 B2 * 1/2011 Kitahara ......................... 216/27
2003/0082851 A1 5/2003 Van Hoff
2005/0101040 A1 5/2005 Lai et al.
2008/0225076 A1 9/2008 McAvoy et al.

FOREIGN PATENT DOCUMENTS

EP 1176012 A2 1/2002
EP 1559557 A2 8/2005
WO WO 2006/009236 A1 1/2006

* cited by examiner

*Primary Examiner* — Allan Olsen

(57) ABSTRACT

A method of fabricating a printhead integrated circuit configured for backside electrical connections. The method comprises the steps of: (a) providing a wafer comprising a plurality of partially-fabricated nozzle assemblies on a frontside of the wafer and through-silicon connectors extending from the frontside towards a backside of the wafer; (b) depositing a conductive layer on the frontside of said wafer and etching to form an actuator for each nozzle assembly and a frontside contact pad over a head of each through-silicon connector; (c) performing further MEMS processing steps to complete formation of nozzle assemblies ink supply channels through-silicon connectors; and (d) dividing the wafer into individual printhead integrated circuits. Each printhead integrated circuit thus formed is configured for backside-connection to the drive circuitry via the through-silicon connectors the contact pads.

20 Claims, 24 Drawing Sheets

METHOD OF FABRICATING PRINTHEAD INTEGRATED CIRCUIT WITH BACKSIDE ELECTRICAL CONNECTIONS

FIELD OF THE INVENTION

The present invention relates to printers and in particular inkjet printers. It is has been developed primarily for providing improved mounting of printhead integrated circuits so as to facilitate printhead maintenance.

CO-PENDING APPLICATIONS

The following applications have been filed by the Applicant simultaneously with the present application:

| | | | | |
|---|---|---|---|---|
| 12/509,487 | 12/509,488 | 12/509,489 | 12/509,490 | 12/509,491 |

The disclosures of these co-pending applications are incorporated herein by reference. The above applications have been identified by their filing docket number, which will be substituted with the corresponding application number, once assigned.

CROSS REFERENCES TO RELATED APPLICATIONS

The following patents and patent applications, filed by the applicant or assignee of the present invention, are hereby incorporated by cross-reference.

| | | | |
|---|---|---|---|
| 7,364,263 | 7,331,663 | 7,331,661 | 7,441,865 |
| 7,469,990 | 7,475,976 | 2007/0,206,059 | 12/014,767 |
| 12/014,768 | 12/014,769 | 12/014,770 | 12/014,771 |
| 12/014,772 | 12/049,371 | 12/049,373 | 6,902,255 |
| 7,416,280 | 7,404,625 | 2008/0,309,729 | 2008/0,129,793 |
| 2008/0,129,784 | 2008/0,225,076 | 2008/0,225,077 | 2008/0,225,078 |
| 6,612,687 | 6,328,425 | 7,252,775 | 7,431,431 |
| 7,491,911 | 6,755,509 | 7,246,886 | 7,401,901 |
| 7,322,681 | 7,401,405 | 7,275,805 | 7,465,017 |
| 7,445,311 | 2007/0,081,014 | 2007/0,206,072 | 12/062,514 |

BACKGROUND OF THE INVENTION

The Applicant has previously demonstrated that pagewidth inkjet printheads may be constructed using a plurality of printhead integrated circuits (‘chips’), which are abutted end-on-end along the width of a page. Although this arrangement of printhead integrated circuits has many advantages (e.g minimizing the width of a print zone in the paper feed direction), each printhead integrated circuit must still be connected to other printer electronics, which supply power and data to each printhead integrated circuit.

Hitherto, the Applicant has described how a printhead integrated circuit may be connected to an external power/data supply by wirebonding bond pads on each printhead integrated circuit to a flex PCB (see, for example, U.S. Pat. No. 7,441,865). However, wirebonds protrude from the ink ejection face of the printhead and can, therefore, have a deleterious effect on both print maintenance and print quality.

It would be desirable to provide a printhead assembly in which printhead integrated circuits are connected to an external power/data supply without these connections affecting print maintenance and/or print quality.

SUMMARY OF THE INVENTION

Accordingly, in a first aspect there is provided an inkjet printhead assembly comprising:

an ink supply manifold;

one or more printhead integrated circuits, each printhead integrated circuit having a frontside comprising drive circuitry and a plurality of inkjet nozzle assemblies, a backside attached to the ink supply manifold, and at least one ink supply channel for providing fluid communication between the backside and the inkjet nozzle assemblies; and at least one connector film for supplying power to the drive circuitry, wherein a connection end of the connector film is sandwiched between at least part of the ink supply manifold and the one or more printhead integrated circuits.

Inkjet printhead assemblies according to the present invention advantageously provide a convenient means for attaching printhead integrated circuits to an ink supply manifold whilst accommodating electrical connections to the printhead. Furthermore, the frontside face of the printhead is fully planar along its entire extent.

Optionally, the connector film comprises a flexible polymer film having a plurality of conductive tracks.

Optionally, the connector film is a tape-automated bonding (TAB) film.

Optionally, the backside has a recessed portion for accommodating the connector film.

Optionally, the recessed portion is defined along a longitudinal edge region of each printhead integrated circuit.

Optionally, a plurality of through-silicon connectors provide electrical connection between the drive circuitry and the connection end of the connector film.

Optionally, each through-silicon connector extends linearly from the frontside towards the backside.

Optionally, each through-silicon connector is tapered towards the backside.

Optionally, each through-silicon connector is comprised of copper.

Optionally, each printhead integrated circuit comprises:

a silicon substrate;

at least one CMOS layer comprising the drive circuitry; and a MEMS layer comprising the inkjet nozzle assemblies, wherein the CMOS layer is positioned between the silicon substrate and the MEMS layer.

Optionally, each through-silicon connector extends linearly from a contact pad in the MEMS layer, through the CMOS layer and towards the backside, the contact pad being electrically connected to the CMOS layer.

Optionally, the printhead assembly comprises one or more conductor posts extending linearly between the contact pad and the CMOS layer.

Optionally, each through-silicon connector is electrically insulated from the CMOS layer.

Optionally, each through-silicon connector has outer sidewalls comprising an insulating film.

Optionally, the outer sidewalls comprise a diffusion barrier layer between the insulating film and a conductive core of the through-silicon connector.

Optionally, each through-silicon connector is connected to the connection end of the film with solder.

Optionally, the film is bonded to the ink supply manifold together with a plurality of the printhead integrated circuits.

Optionally, the plurality of printhead integrated circuits are positioned in an end-on-end butting arrangement to provide a pagewidth printhead assembly.

Optionally, a frontside face of the printhead is planar and free of any wirebond connections.

Optionally, the frontside face is coated with a hydrophobic polymer layer (e.g. PDMS).

In a second aspect, there is provided a printhead integrated circuit having:

a frontside comprising drive circuitry and a plurality of inkjet nozzle assemblies;

a backside for attachment to an ink supply manifold; and at least one ink supply channel for providing fluid communication between the backside and the inkjet nozzle assemblies, wherein the backside has a recessed portion for accommodating at least part of a connector film supplying power to the drive circuitry.

Optionally, a connection end of the connector film is sandwiched between at least part of the ink supply manifold and the printhead integrated circuit when the backside is attached to the ink supply manifold.

Optionally, the recessed portion is defined along a longitudinal edge region of the printhead integrated circuit.

Optionally, the recessed portion comprises a plurality of integrated circuit contacts, each integrated circuit being connected to the drive circuitry.

Optionally, the connector film is a tape-automated bonding (TAB) film, and wherein the integrated circuit contacts are positioned for connection to corresponding contacts of the TAB film.

Optionally, a plurality of through-silicon connectors extend linearly from the frontside towards the backside, each through-silicon connector providing an electrical connection between the drive circuitry and a corresponding integrated circuit contact.

Optionally, each integrated circuit contact is defined by an end of a respective through-silicon connector.

Optionally, the backside has a plurality of ink supply channels extending longitudinally along the printhead integrated circuit, each ink supply channel defining one or more ink inlets for receiving ink from the ink supply manifold. Optionally, each ink supply channel supplies ink to a plurality of frontside inlets. Optionally, each frontside inlet supplies ink to one or more of the inkjet nozzle assemblies.

Optionally, each ink supply channel has a depth corresponding to a depth of the recessed portion.

In a third aspect, there is provided a printhead integrated circuit comprising:

a silicon substrate defining a frontside and a backside;

a plurality of inkjet nozzle assemblies positioned at the frontside;

drive circuitry for supply power to the inkjet nozzle assemblies; and one or more through-silicon connectors extending from the frontside towards the backside, the through-silicon connectors providing electrical connections between the drive circuitry and one or more corresponding integrated circuit contacts, wherein the integrated circuit contacts are positioned for connection to a backside-mounted connector film supplying power to the drive circuitry.

Optionally, each integrated circuit contact is defined by an end of a respective through-silicon connector.

In a fourth aspect, there is provided a method of fabricating an inkjet printhead assembly having backside electrical connections, the method comprising the steps of:

providing one or more printhead integrated circuits, each printhead integrated circuit having a frontside comprising drive circuitry and a plurality of inkjet nozzle assemblies, a backside having one or more ink inlets and a recessed edge portion, and one or more connectors extending through the integrated circuit, each connector having a head connected to the drive circuitry and a base in the recessed edge portion;

positioning a connection end of a connector film in the recessed edge portion of at least one of the printhead integrated circuits, the connector film comprising a plurality of conductive tracks, each conductive track having a respective film contact at the connection end;

connecting each film contact to the base of a corresponding connector; and attaching the backside of each printhead integrated circuit together with the connector film to an ink supply manifold so as to provide the inkjet printhead assembly having backside electrical connections.

Optionally, the attaching step sandwiches the connection end of the connector film between part of the ink supply manifold and the one or more printhead integrated circuits.

Optionally, the film is a tape-automated bonding (TAB) film.

Optionally, the connecting step comprises soldering each film contact to the base of its corresponding connector.

Optionally, the attaching step is performed using an adhesive film.

Optionally, the adhesive film has a plurality of ink supply apertures defined therein.

Optionally, the attaching step comprises aligning each printhead integrated circuit with the adhesive film such that each ink supply aperture is aligned with an ink inlet, bonding the printhead integrated circuits to one side of the adhesive film, and bonding an opposite side of the film to the ink supply manifold.

Optionally, in the connecting step, each printhead integrated circuit is connected to a respective connector film.

Optionally, in the connecting step, a plurality of printhead integrated circuits are connected to the same connector film.

Optionally, the plurality of printhead integrated circuits are attached to the ink supply manifold in an end-on-end butting arrangement to provide a pagewidth printhead assembly.

In a fifth aspect, there is provided a method of fabricating a printhead integrated circuit configured for backside electrical connections, the method comprising the steps of:

providing a wafer comprising a plurality of partially-fabricated nozzle assemblies on a frontside of the wafer and one or more through-silicon connectors extending from the frontside towards a backside of the wafer;

depositing a conductive layer on the frontside of the wafer and etching the conductive layer so as to form, concomitantly, an actuator for each nozzle assembly and a frontside contact pad over a head of each through-silicon connector, the frontside contact pad connecting the through-silicon connector to drive circuitry in the wafer;

performing further MEMS processing steps to complete formation of the nozzle assemblies, ink supply channels for the nozzle assemblies and the through-silicon connectors; and dividing the wafer into a plurality of individual printhead integrated circuits, each printhead integrated circuit being configured for backside-connection to the drive circuitry via the through-silicon connector and the contact pad.

Optionally, the conductive material is selected from the group consisting of: titanium nitride, titanium aluminium nitride, titanium, aluminium, and vanadium-aluminium alloy.

Optionally, the actuator is selected from the group consisting of: a thermal bubble-forming actuator and a thermal bend actuator.

Optionally, the further MEMS processing steps comprise depositing a material onto the contact pad so as to seal or encapsulate the contact pad.

Optionally, the further MEMS processing steps comprise etching a backside of the wafer so as to define the ink supply channels and a backside recessed portion for each printhead integrated circuit.

Optionally, the ink supply channels and the backside recessed portion have a same depth.

Optionally, the backside etching exposes a foot of each through-silicon connector in the backside recessed portion, each foot comprising an integrated circuit contact.

Optionally, the through-silicon connectors are positioned along a longitudinal edge region of each printhead integrated circuit, and the backside recessed portion extends along the longitudinal edge region.

Optionally, the integrated circuit contacts are positioned for connection to corresponding contacts of a TAB film.

Optionally, a CMOS layer comprises the drive circuitry, and the nozzle assemblies are disposed in a MEMS layer formed on the CMOS layer.

Optionally, one or more conductor posts extend linearly between the contact pad and the CMOS layer and/or between the actuator and the CMOS layer.

Optionally, the conductor posts are formed prior to deposition of the conductive layer.

Optionally, the conductor posts are formed concomitantly with the through-silicon connectors.

Optionally, the conductor posts and the through-silicon connectors are formed by deposition of a conductive material into predefined vias.

Optionally, the conductive material is deposited by an electroless plating process.

Optionally, each of the predefined vias has a diameter proportionate with a depth such that the all the vias are filled evenly by the deposition.

Optionally, the conductive material is copper.

Optionally, the further MEMS processing steps comprise coating a frontside face with a hydrophobic polymer layer.

Optionally, the hydrophobic polymer layer is comprised of PDMS.

Optionally, the further MEMS processing steps comprise oxidatively removing sacrificial material.

BRIEF DESCRIPTION OF THE DRAWINGS

Embodiments of the present invention will now be described in detail with reference to following drawings in which.

DETAILED DESCRIPTION OF EMBODIMENTS OF THE INVENTION

Ink Supply to Printhead Integrated Circuits (ICs)

Figure 1:
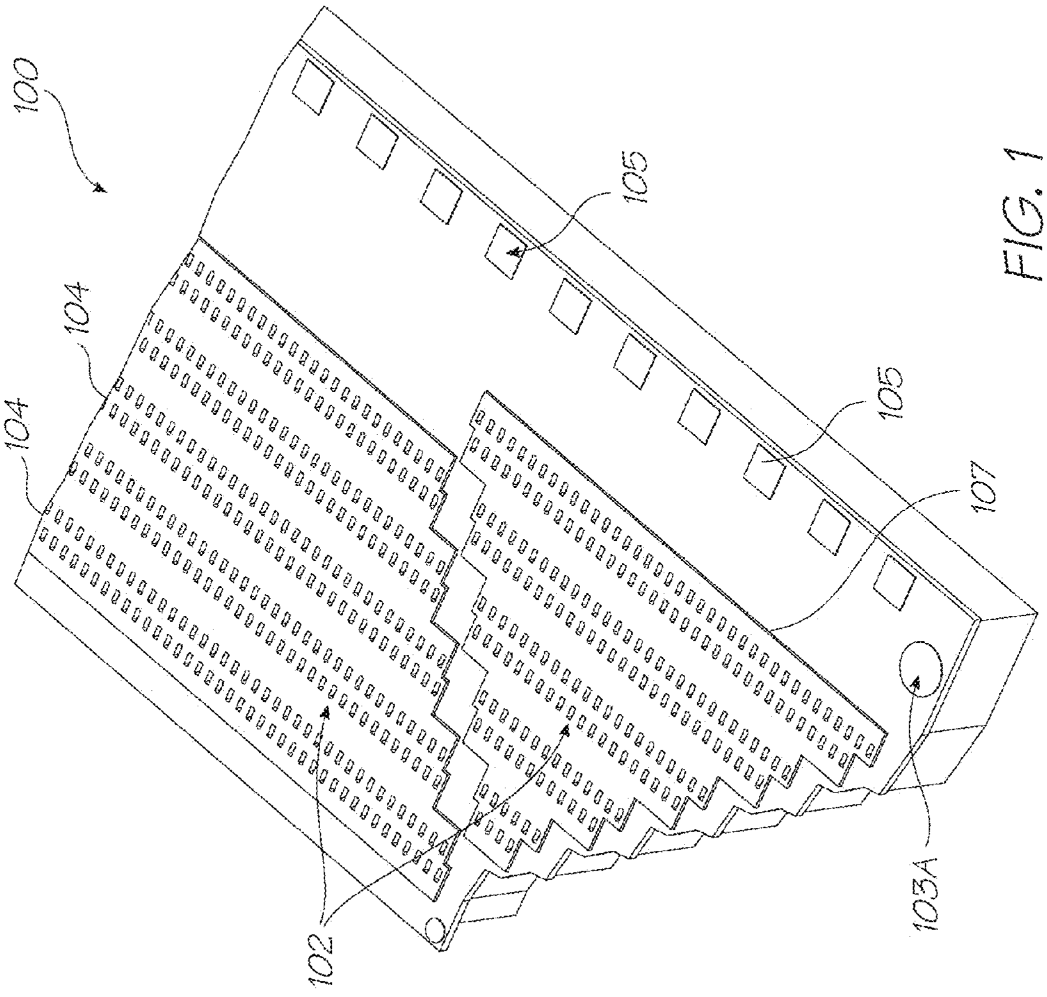
FIG. 1 is a front perspective of a printhead integrated circuit.
Figure 2:
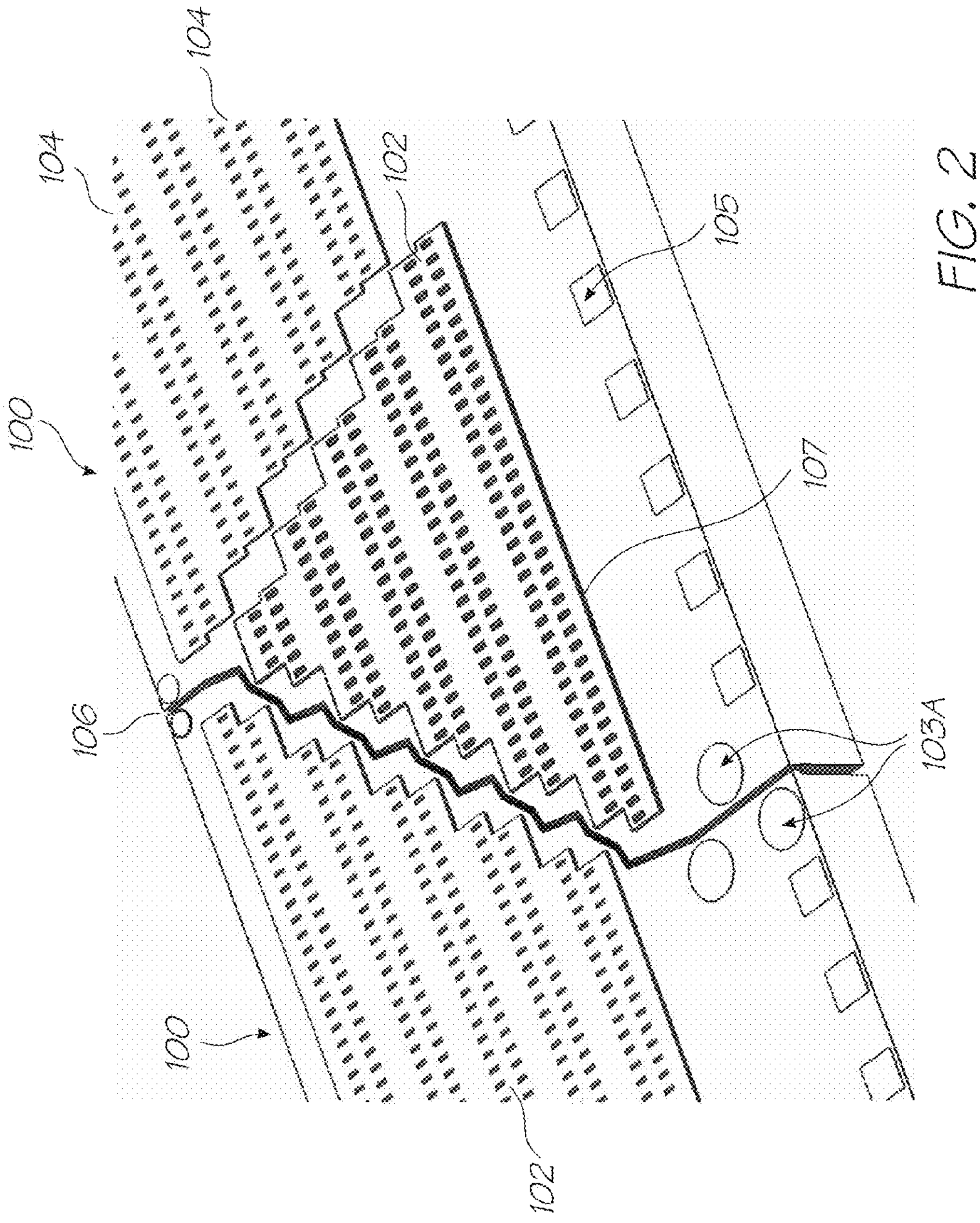
FIG. 2 is a front perspective of a pair of butting printhead integrated circuits.

Hitherto, the Applicant has described printhead integrated circuits (or 'chips') 100 which may be linked together in a butting end-on-end arrangement to define a pagewidth printhead. FIG. 1 shows a frontside face of part of a printhead IC 100 in perspective, whilst FIG. 2 shows a pair of printhead ICs butted together.

Each printhead IC 100 comprises thousands of nozzles 102 arranged in rows. As shown in FIGS. 1 and 2, the printhead IC 100 is configured to receive and print five different colors of ink (e.g CMYK and IR (infrared); CCMMY; or CMYKK). Each color channel 104 of the printhead IC 100 comprises a paired row of nozzles, one row of the pair printing even dots and the other row of the pair printing odd dots. Nozzles from each color channel 104 are vertically aligned, in a paper feed direction, to perform dot-on-dot printing at high resolution (e.g. 1600 dpi). A horizontal distance ('pitch') between two adjacent nozzles 102 on a single row is about 32 microns, whilst the vertical distance between rows of nozzles is based on the firing order of the nozzles; however, rows are typically separated by an exact number of dot lines (e.g. 10 dot lines). A more detailed description of nozzle row arrangements and nozzle firing can be found in U.S. Pat. No. 7,438,371, the contents of which are herein incorporated by reference.

The length of an individual printhead IC 100 is typically about 20 to 22 mm. Thus, in order to print an A4/US letter sized page, eleven or twelve individual printhead ICs 100 are contiguously linked together. The number of individual printhead ICs 100 may be varied to accommodate sheets of other widths. For example, a 4" photo printer typically employs five printhead ICs linked together.

The printhead ICs 100 may be linked together in a variety of ways. One particular manner for linking the ICs 100 is shown in FIG. 2. In this arrangement, the ICs 100 are shaped at their ends so as to link together and form a horizontal line of ICs, with no vertical offset between neighboring ICs. A sloping join 106, having substantially a 45° angle, is provided between the printhead ICs. The joining edge has a sawtooth profile to facilitate positioning of butting printhead ICs.

As will be apparent from FIGS. 1 and 2, the leftmost ink delivery nozzles 102 of each row are dropped by 10 line pitches and arranged in a triangle configuration 107. This arrangement maintains the pitch of the nozzles across the join 106 to ensure that the drops of ink are delivered consistently along a print zone. This arrangement also ensures that more silicon is provided at the edge of each printhead IC 100 to ensure sufficient linkage between butting ICs. The nozzles contained in each dropped row must be fired at a different time to ensure that nozzles in a corresponding row fire onto the same line on a page. Whilst control of the operation of the nozzles is performed by a printhead controller ("SoPEC") device, compensation for the dropped rows of nozzles may be performed by CMOS circuitry in the printhead, or may be shared between the printhead and the SoPEC device. A full description of the dropped nozzle arrangement and control thereof is contained in U.S. Pat. No. 7,275,805, the contents of which are herein incorporated by reference.

Figure 3:
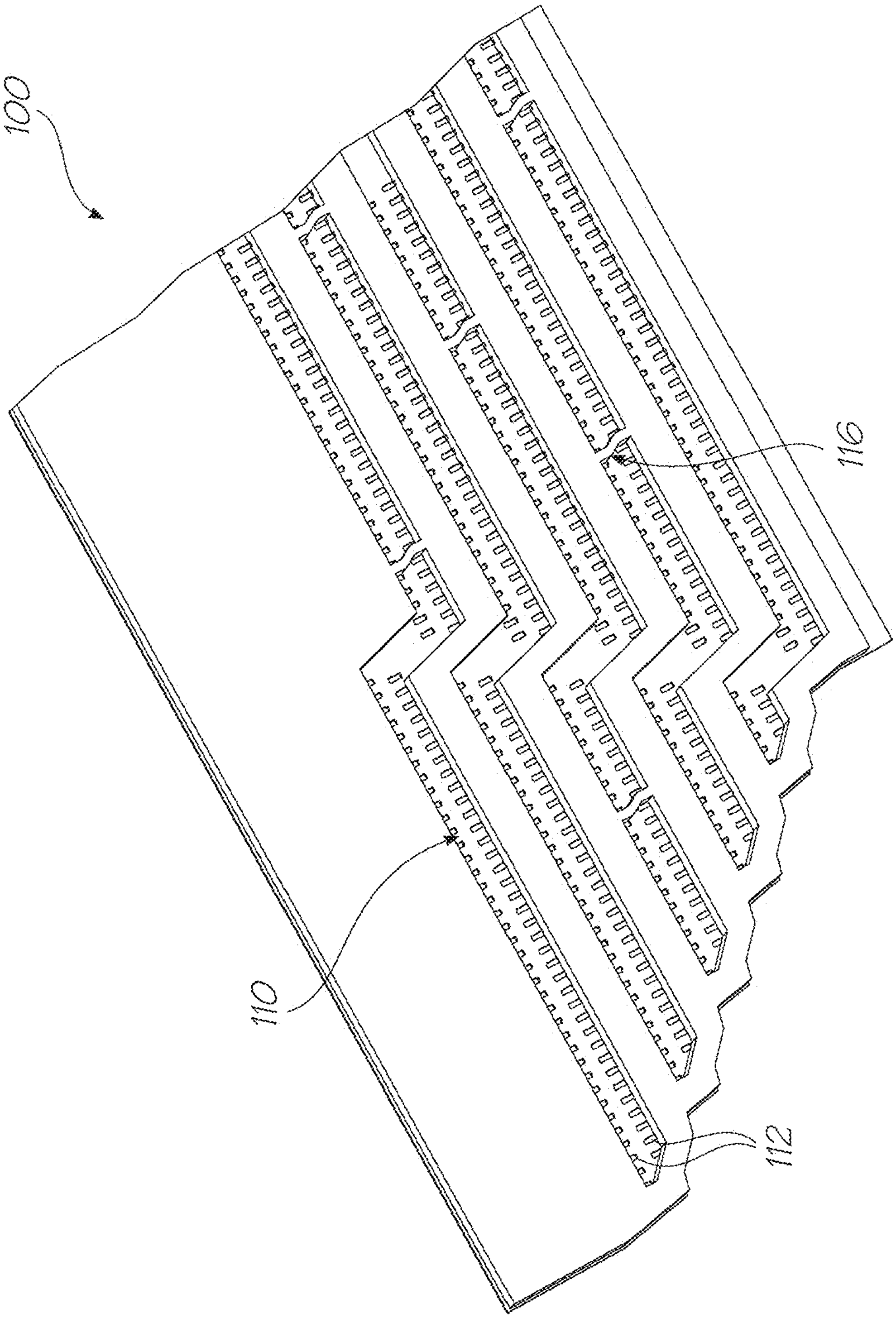
FIG. 3 is a rear perspective of the printhead integrated circuit shown in FIG. 1.
Figure 4:
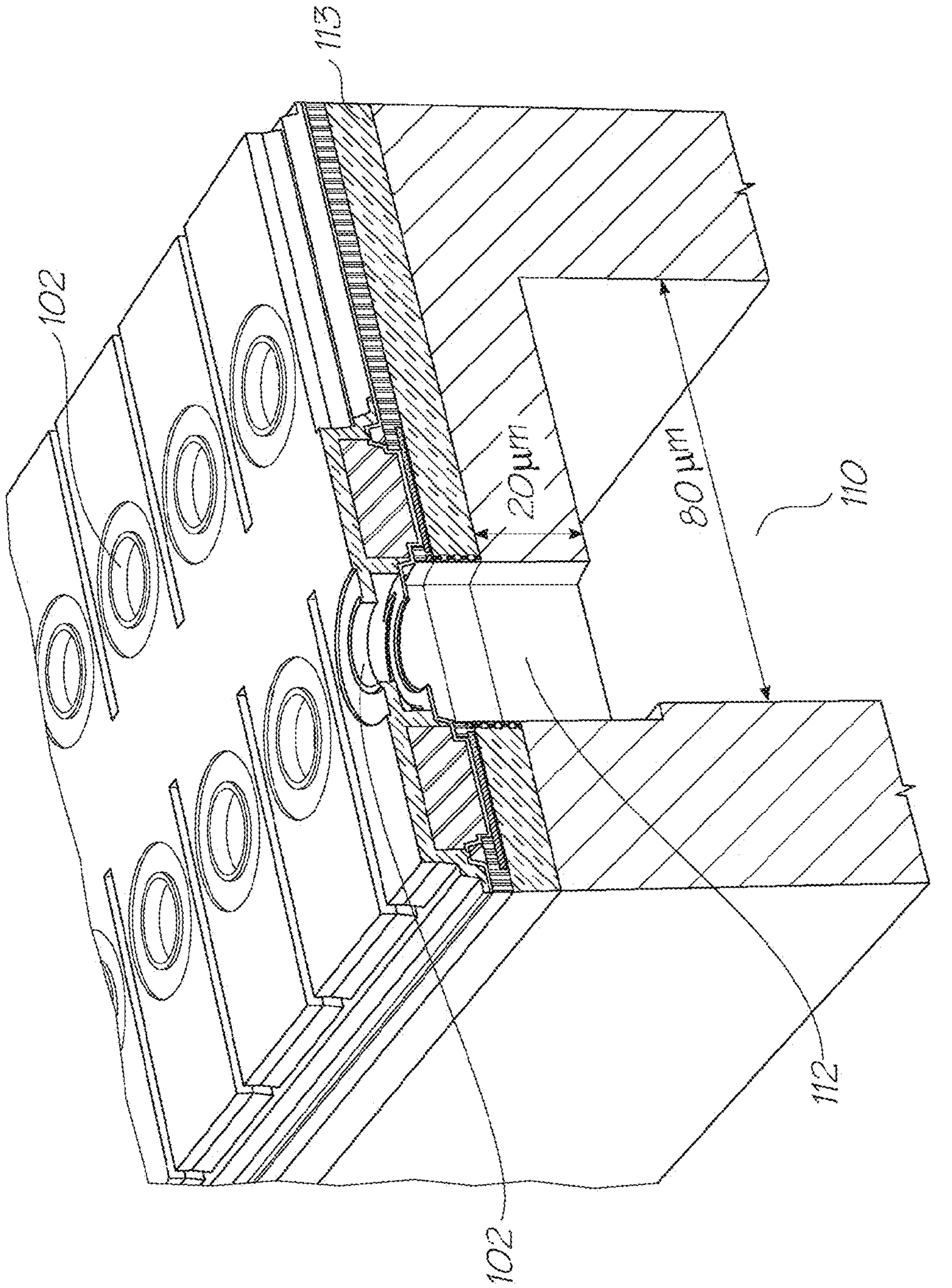
FIG. 4 is a cutaway perspective of an inkjet nozzle assembly having a floor nozzle inlet.
Figure 5:
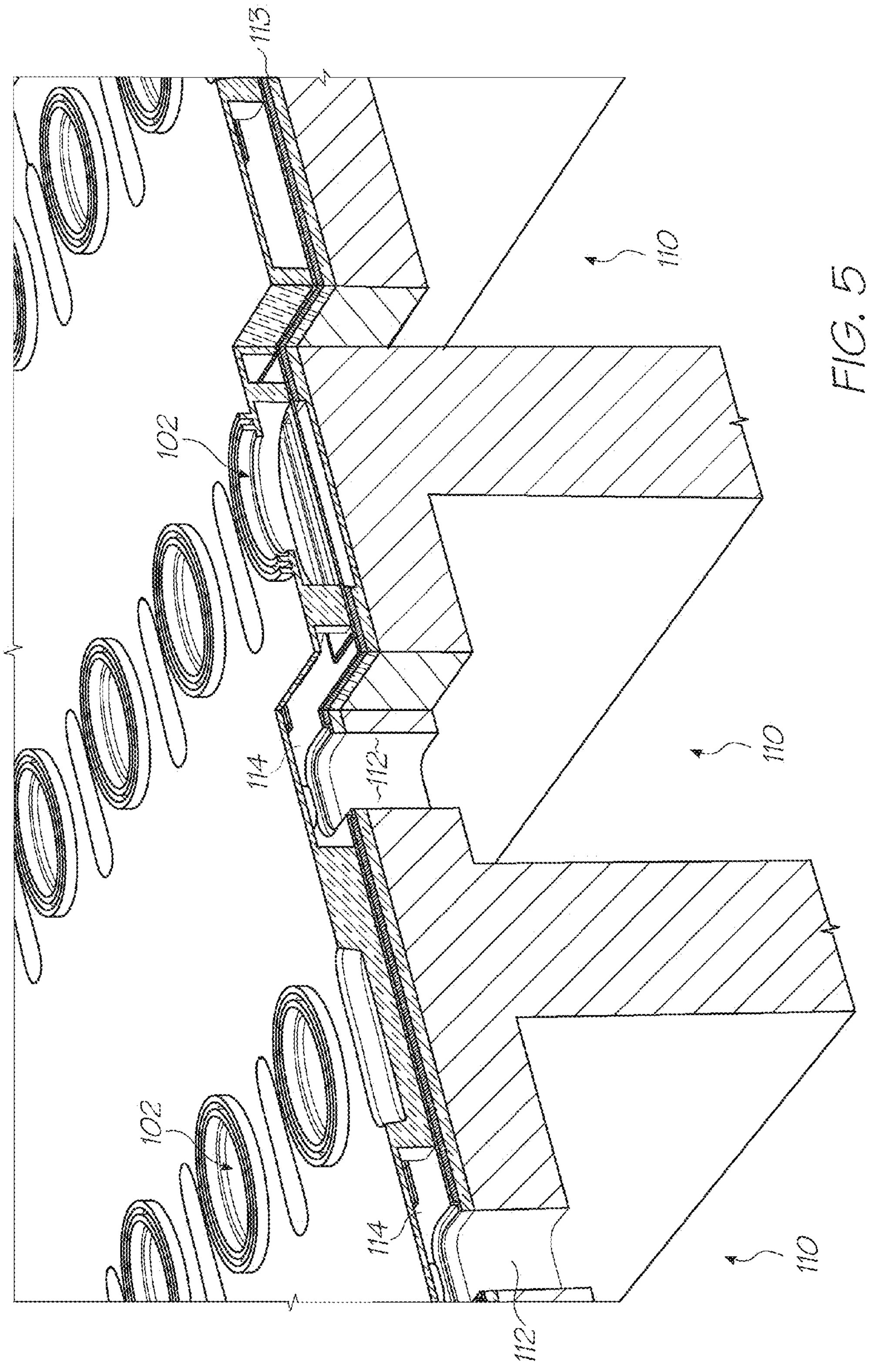
FIG. 5 is a cutaway perspective of an inkjet nozzle assembly having a sidewall nozzle inlet.
Figure 6:
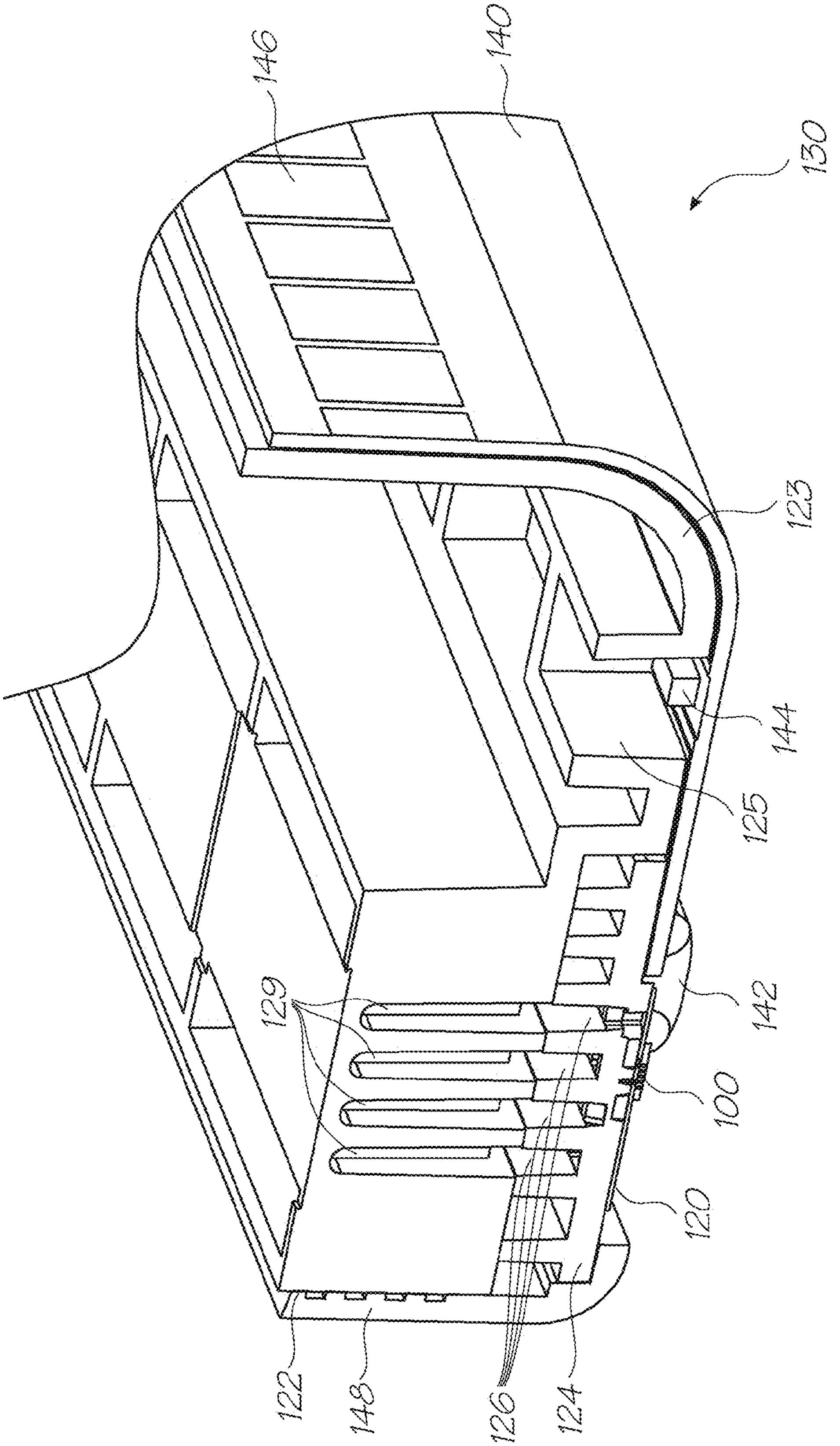
FIG. 6 is a side perspective of a printhead assembly.
Figure 7:
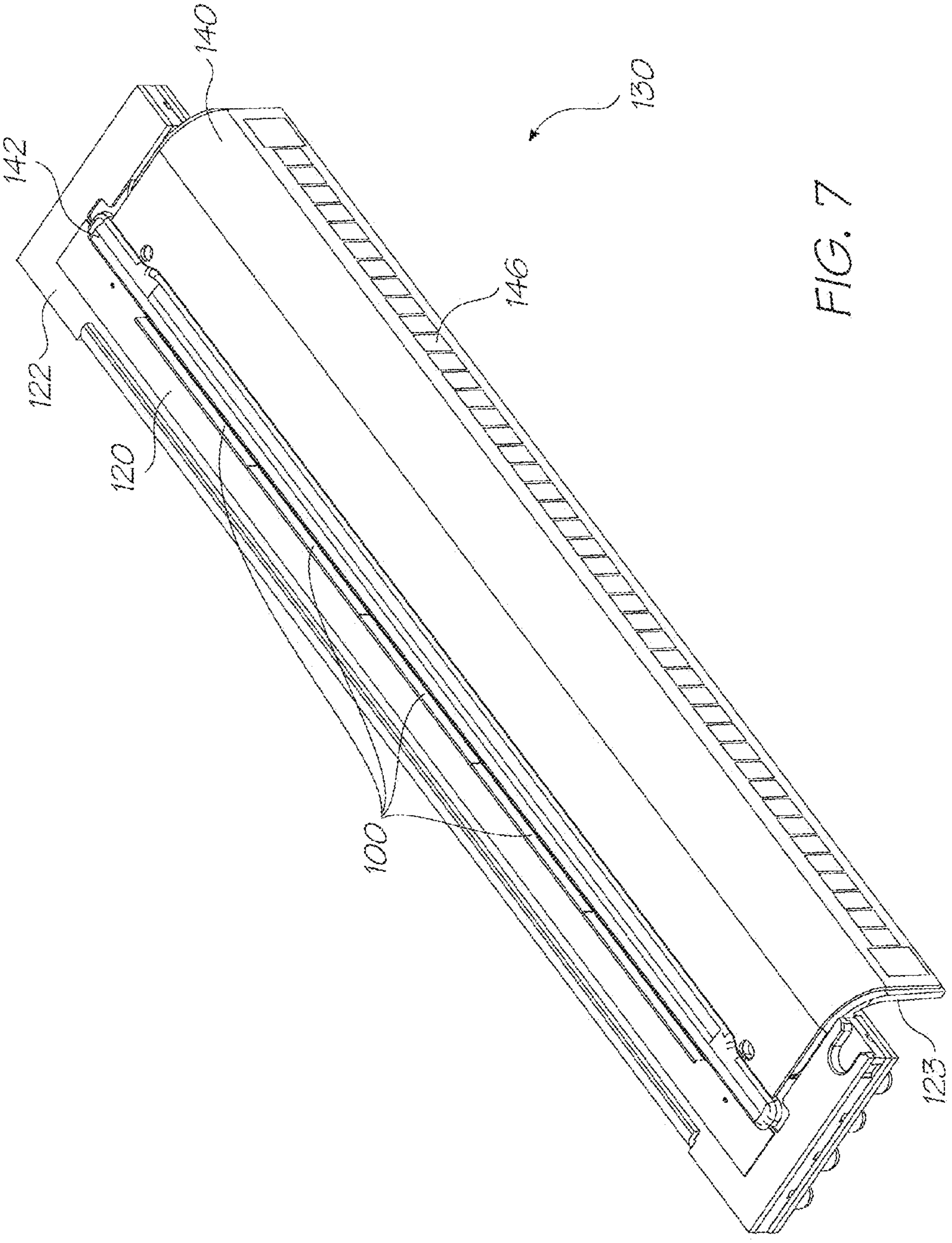
FIG. 7 is a lower perspective of the printhead assembly shown in FIG. 6.
Figure 8:
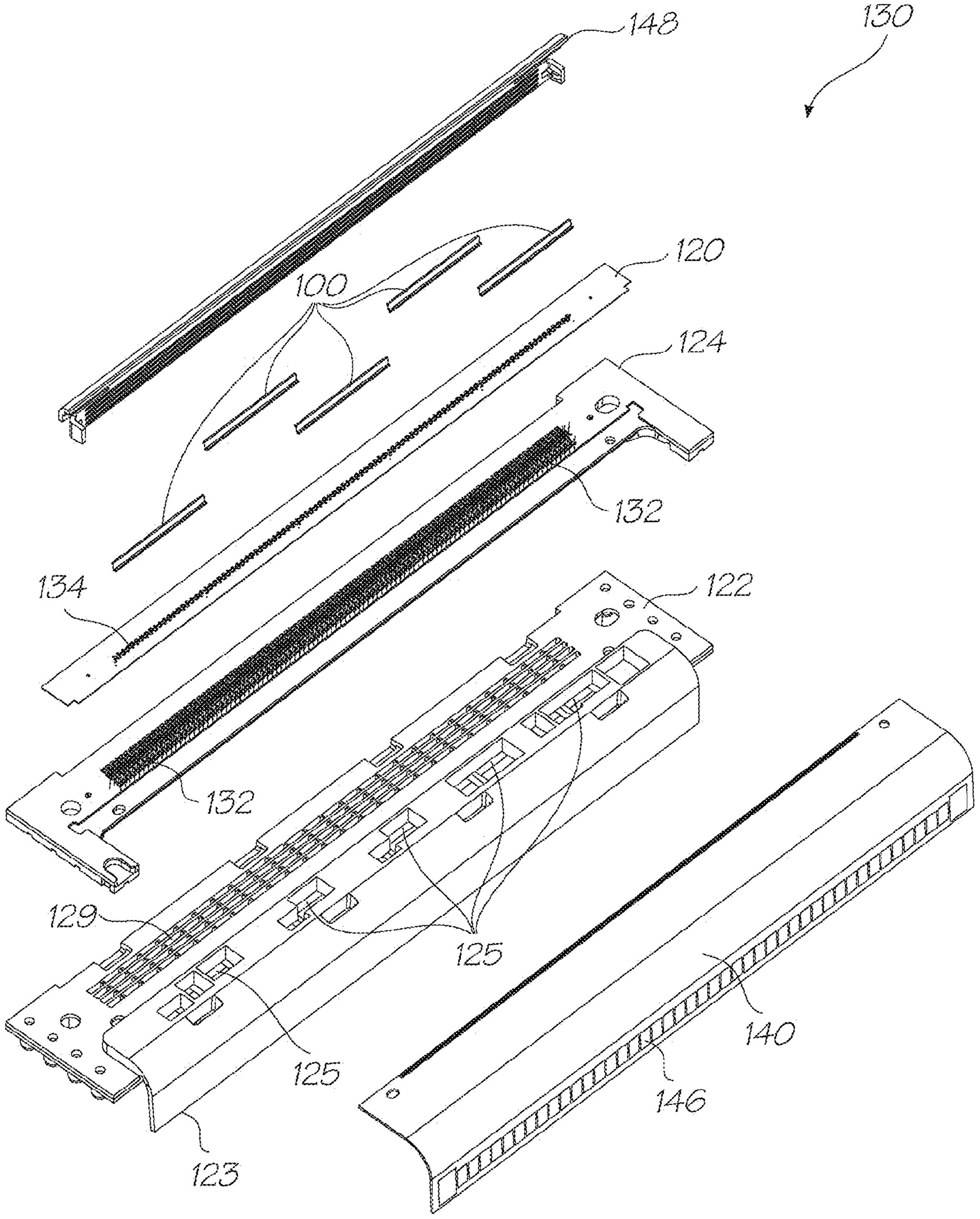
FIG. 8 is an exploded upper perspective of the printhead assembly shown in FIG. 6.
Figure 9:
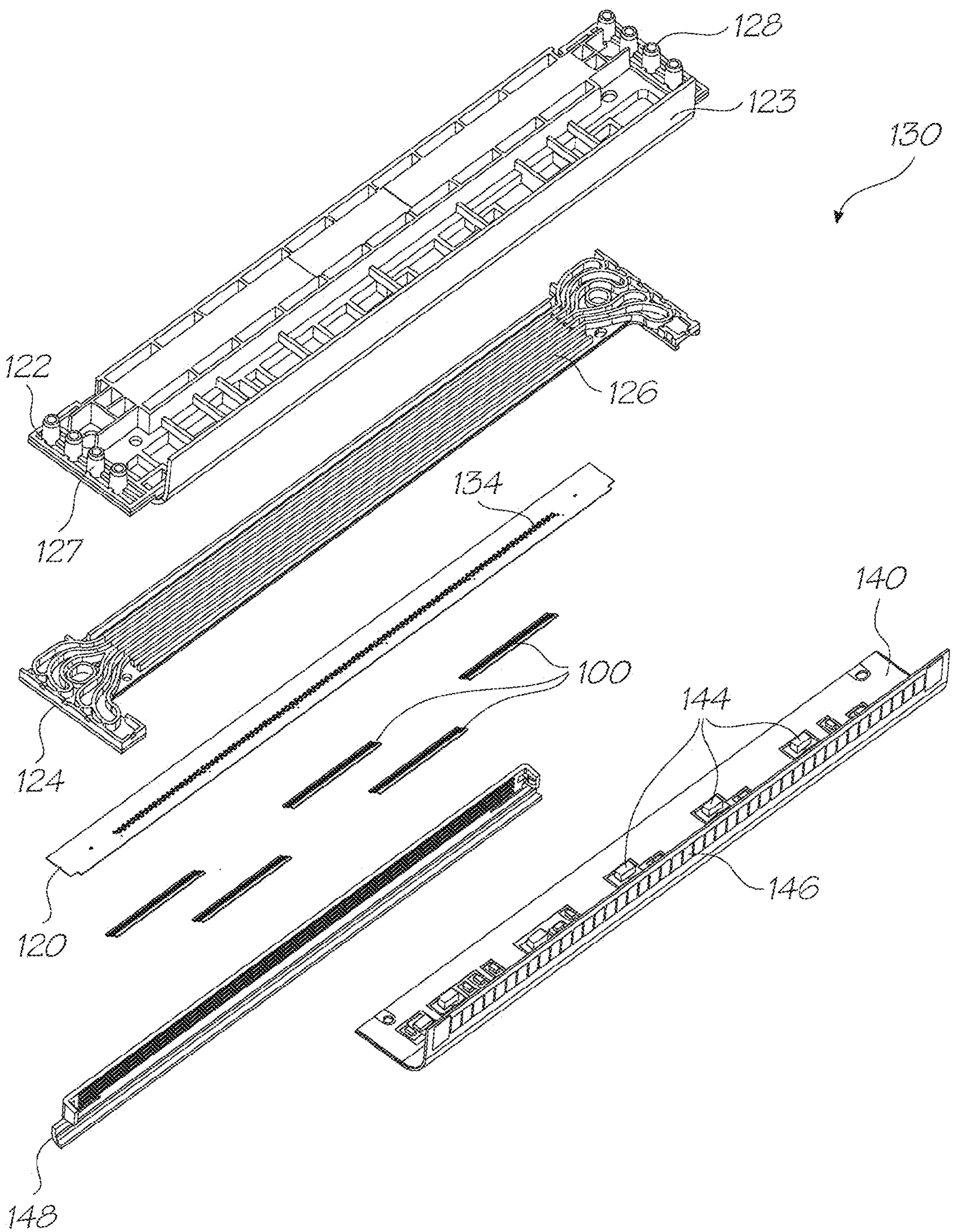
FIG. 9 is an exploded lower perspective of the printhead assembly shown in FIG. 6.

Referring now to FIG. 3, there is shown an opposite backside face of the printhead integrated circuit 100. Ink supply channels 110 are defined in the backside of the printhead IC 100, which extend longitudinally along the length of the printhead IC. These longitudinal ink supply channels 110 meet with nozzle inlets 112, which fluidically communicate with the nozzles 102 in the frontside. FIG. 4 shows part of a printhead IC where the nozzle inlet 112 feeds ink directly into a nozzle chamber. FIG. 5 shows part of an alternative printhead IC where the nozzle inlets 112 feed ink into ink conduits 114 extending longitudinally alongside each row of nozzle chambers. In this alternative arrangement, the nozzle chambers receive ink via a sidewall entrance from its adjacent ink conduit ambit of the present invention.

Returning to FIG. 3, the longitudinally extending ink supply channels 110 are divided into sections by silicon bridges or walls 116. These walls 116 provide the printhead IC 100 with additional mechanical strength in a transverse direction relative to the longitudinal channels 110.

Ink is supplied to the backside of each printhead IC 100 via an ink supply manifold in the form a two-part LCP molding. Referring to FIGS. 6 to 9, there is shown a printhead assembly 130 comprising printheads ICs 100, which are attached to the ink supply manifold via an adhesive film 120.

The ink supply manifold comprises a main LCP molding 122 and an LCP channel molding 124 sealed to its underside. The printhead ICs 100 are bonded to the underside of the channel molding 124 with the adhesive IC attach film 120. The upperside of the LCP channel molding 124 comprises LCP main channels 126, which connect with ink inlets 127 and ink outlets 128 in the main LCP molding 122. The ink inlets 127 and ink outlets 128 fluidically communicate with ink reservoirs and an ink supply system (not shown), which supplies ink to the printhead at a predetermined hydrostatic pressure.

The main LCP molding 122 has a plurality of air cavities 129, which communicate with the LCP main channels 126 defined in the LCP channel molding 124. The air cavities 129 serve to dampen ink pressure pulses in the ink supply system.

At the base of each LCP main channel 126 are a series of ink supply passages 132 leading to the printhead ICs 100. The adhesive film 120 has a series of laser-drilled supply holes 134 so that the backside of each printhead IC 100 is in fluid communication with the ink supply passages 132.

Figure 10:
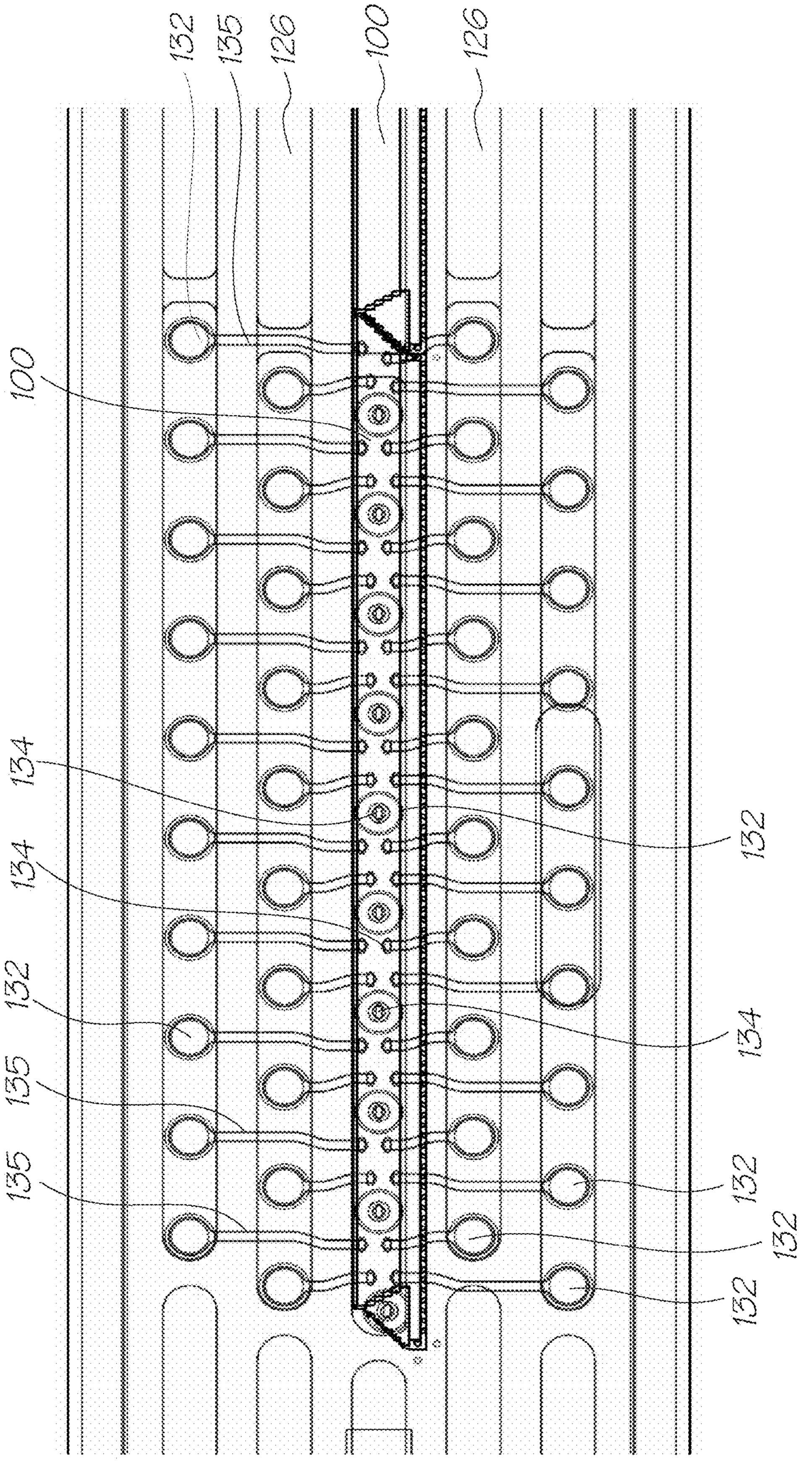
FIG. 10 is overlaid plan view of a printhead integrated circuit attached to an ink supply manifold.

Referring now to FIG. 10, the ink supply passages 132 are arranged in a series of five rows. A middle row of ink supply passages 132 feed ink directly to the backside of the printhead IC 100 through laser-drilled holes 134, whilst the outer rows of ink supply passages 132 feed ink to the printhead IC via micromolded channels 135, each micromolded channel terminating at one of the laser-drilled holes 134.

Figure 11:
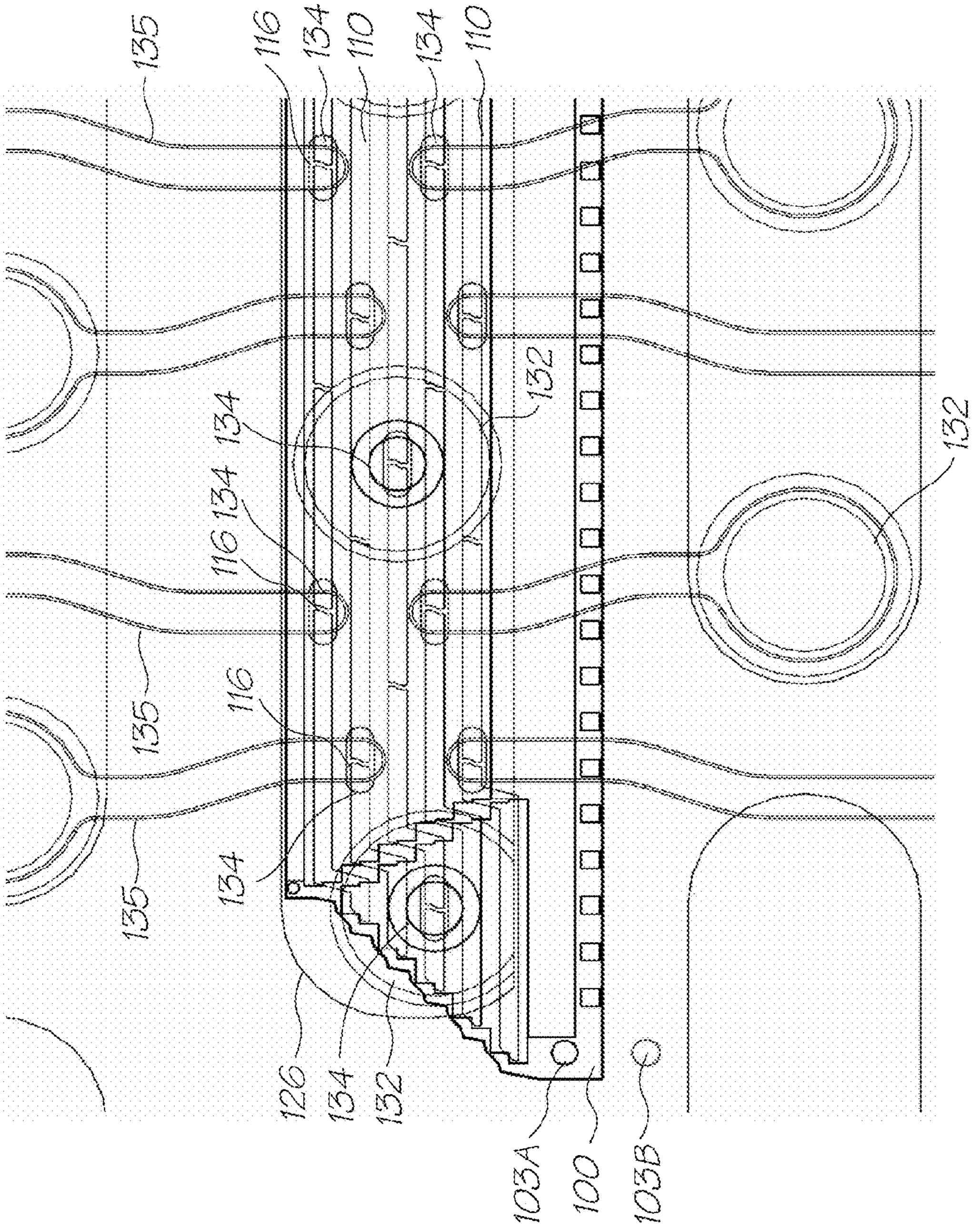
FIG. 11 is a magnified view of FIG. 10.

FIG. 11 shows in more detail how ink is fed to the backside ink supply channels 110 of the printhead ICs 100. Each laser-drilled hole 134, which is defined in the adhesive film 120, is aligned with a corresponding ink supply channel 110. Generally, the laser-drilled hole 134 is aligned with one of the transverse walls 116 in the channel 110 so that ink is supplied to a channel section on either side of the wall 116. This arrangement reduces the number of fluidic connections required between the ink supply manifold and the printhead ICs 100.

To aid in positioning of the ICs 100 correctly, fiducials 103A are provided on the surface of the ICs 100 (see FIGS. 1 and 11). The fiducials 103A are in the form of markers that are readily identifiable by appropriate positioning equipment to indicate the true position of the IC 100 with respect to a neighbouring IC. The adhesive film 120 has complementary fiducials 103B, which aid alignment of each printhead IC 100 with respect to the adhesive film during bonding of the printhead ICs to the ink supply manifold. The fiducials 103A and 103B are strategically positioned at the edges of the ICs 100 and along the length of the adhesive IC attach film 120.

Data and Power Supply to Printhead Integrated Circuits

Returning now to FIG. 1, the printhead IC 100 has a plurality of bond pads 105 extending along one of its longitudinal edges. The bond pads 105 provide a means for receiving data and/or power from the printhead controller ("SoPEC") device to control the operation of the inkjet nozzles 102.

The bond pads 105 are connected to an upper CMOS layer of the printhead IC 100. As shown in FIGS. 4 and 5, each MEMS nozzle assembly is formed on a CMOS layer 113, which contain the requisite logic and drive circuitry for firing each nozzle.

Referring to FIGS. 6 to 9, a flex PCB 140 is wirebonded to the bond pads 105 of the printhead ICs 100. The wirebonds are sealed and protected with a wirebond sealant 142 (see FIG. 7), which is typically a polymeric resin. The LCP molding 122 comprises a curved support wing 123 around which the flex PCB 140 is bent and secured. The support wing 123 has a number of openings 125 for accommodating various electrical components 144 of the flex PCB. In this way, the flex PCB 140 can bend around an outside surface of the printhead assembly 130. A paper guide 148 is mounted to an opposite side of the LCP molding 122, with respect to the flex PCB 140, and completes the printhead assembly 130.

Figure 12:
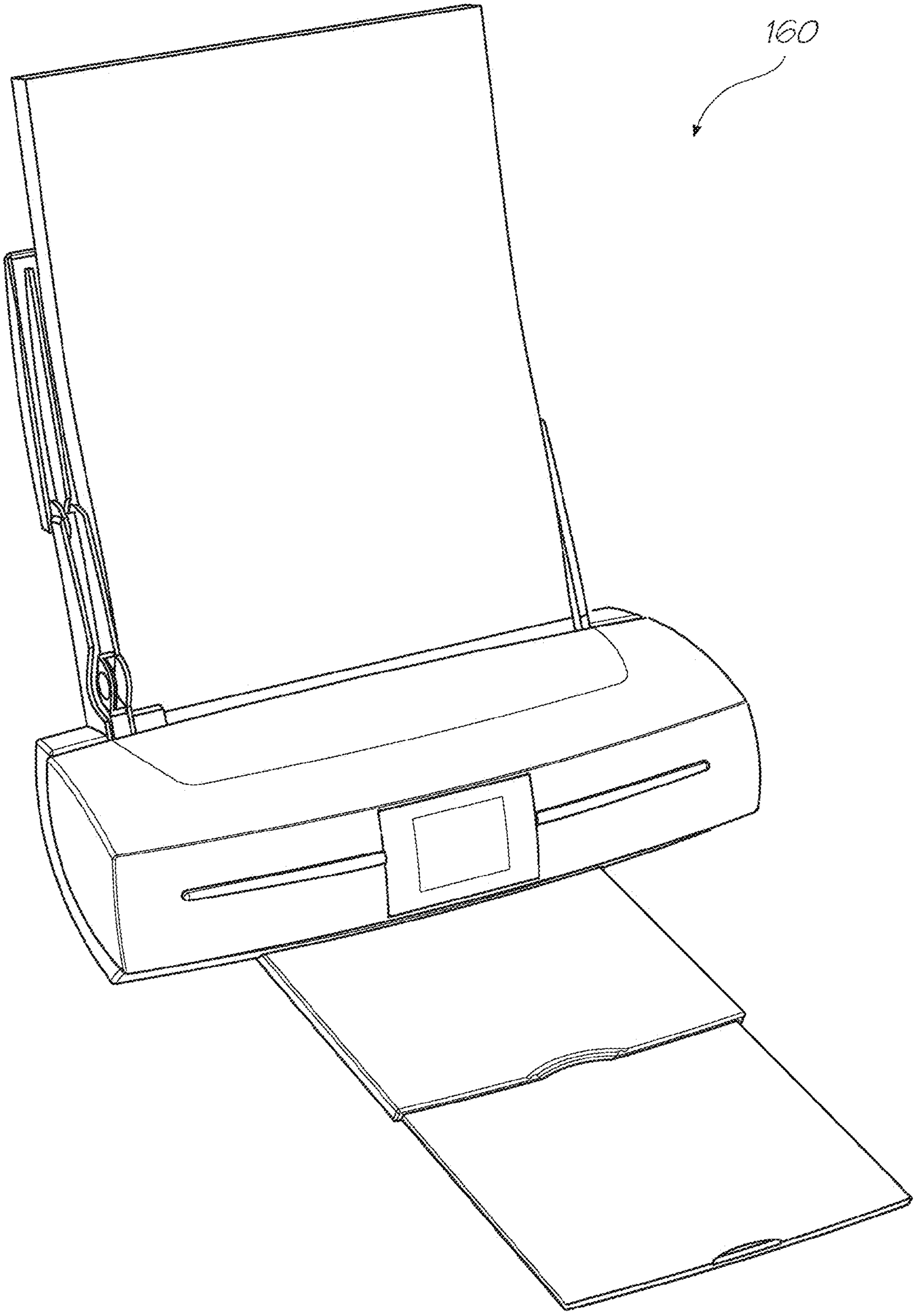
FIG. 12 is a perspective of an inkjet printer.

The printhead assembly 130 is designed as part of a user-replaceable printhead cartridge, which can be removed from and replaced in an inkjet printer 160 (see FIG. 12). Hence, the flex PCB 140 has a plurality of contacts 146 enabling power and data connections to electronics, including the SoPEC device, in the printer body.

Figure 13:
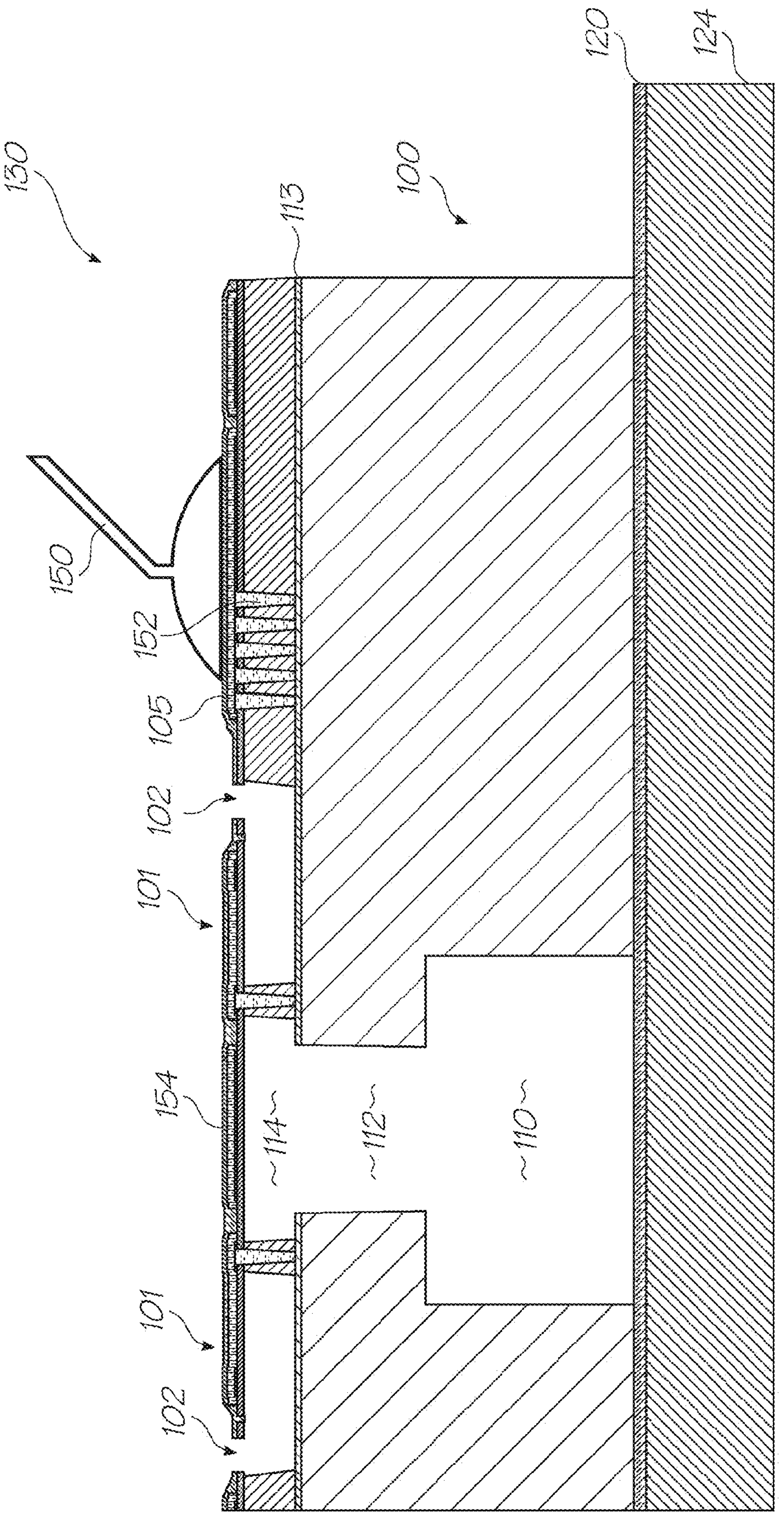
FIG. 13 is a schematic cross-section of the printhead assembly shown in FIG. 6.

Since the flex PCB 140 is wirebonded to bond pads 105 on each printhead IC 100, the printhead inevitably has a non-planar longitudinal edge region in the vicinity of the bond pads. This is illustrated most clearly in FIG. 13, which shows a wirebond 150 extending from a bond pad 105 of a printhead IC 100 comprising a plurality of inkjet nozzle assemblies 101. In the configuration shown in FIG. 13, the bond pad 105 is formed in a MEMS layer and connects to the underlying CMOS 113 via connector posts 152. Alternatively, the bond pad 105 may be an exposed upper layer of the CMOS 113 without any other connections to the MEMS layer. In either configuration, wirebonds extend from an ink ejection face 154 of the printhead and connect with the flex PCB 140.

Wirebonding to the bond pads 105 in the printhead IC 100 has several disadvantages, principally due to the fact that a significant longitudinal region of the printhead IC has wirebonds 150 (and, moreover, the wirebond sealant 142) projecting from its ink ejection face 154. The non-planarity of the ink ejection face 154 may result in less effective printhead maintenance. For example, a wiper blade is unable to sweep across the entire width of the ink ejection face 154 because the wirebond sealant 142 blocks the path of the wiper blade, either upstream or downstream of the nozzles 102 with respect to a wiping direction.

Another disadvantage of wirebond projections is that the entire printhead cannot be coated with a hydrophobic coating, such as PDMS. The Applicant has found that PDMS coatings significantly improve both print quality and printhead maintenance (see, for example, US Publication No. US 2008/0225076, the contents of which is herein incorporated by reference) and a fully planar ink ejection face would improve the efficacy of such coatings even further.

Printhead Integrated Circuit Configured for Backside Electrical Connections

In view of some of the inherent disadvantages of wirebond connections to the printhead IC 100, the Applicant has developed a printhead IC 2, which uses backside electrical connections and therefore has a fully planar ink ejection face.

Figure 14:
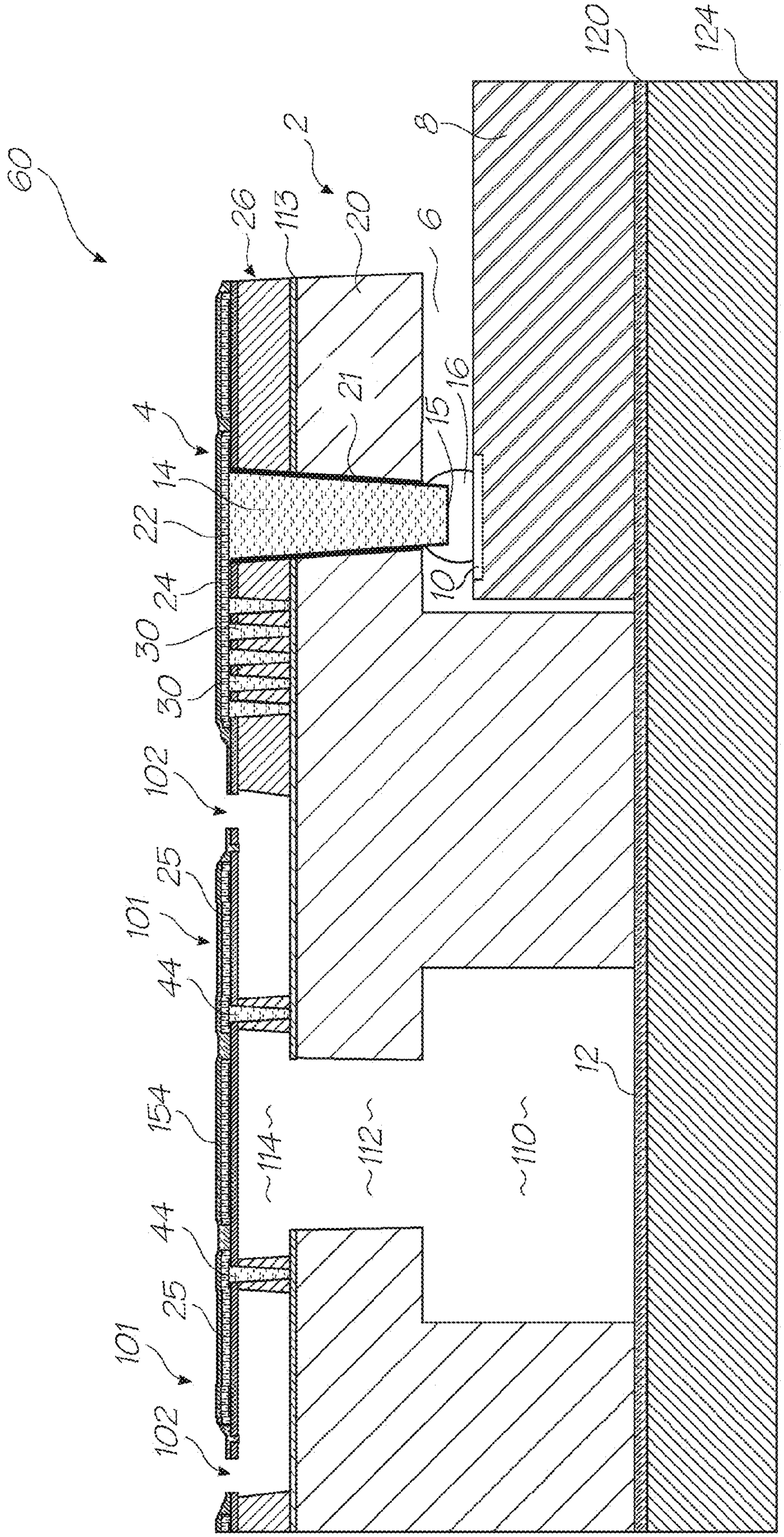
FIG. 14 is a schematic cross-section of a printhead assembly according to the present invention.

Referring to FIG. 14, the printhead IC 2 is mounted to the LCP channel molding 124 of the ink supply manifold using the adhesive film 120. The printhead IC 2 has at least one longitudinal ink supply channel 110, which provides fluidic communication between the ink supply manifold and the nozzle assemblies 101 via the nozzle inlet 112 and ink conduit 114. Hence, the printhead assembly 60 (which includes printhead IC 2), has the same fluidic arrangement as the printhead assembly 130 (which includes printhead IC 100) described above in connection with FIGS. 1 to 11.

However, the printhead IC 2 differs from the printhead IC 100 by virtue of the electrical connections made to its CMOS circuitry layers 113. Significantly, the printhead IC 2 lacks any frontside wirebonding along its longitudinal edge region 4. Rather, the printhead IC 2 has a backside recess 6 at its longitudinal edge, which accommodates a TAB (tape-automated bonding) film 8. The TAB film 8 is typically a flexible polymer film (e.g. Mylar® film) comprising a plurality of conductive tracks terminating at corresponding film contacts 10 at a connector end of the TAB film. The TAB film 8 is positioned flush with a backside surface 12 of the printhead IC 2 so that the TAB film and the printhead IC 2 can be bonded together to the LCP channel molding 124. The TAB film 8 may be connected to the flex PCB 140; indeed, the TAB film may be integrated with the flex PCB 140. Alternatively, the TAB film 8 may be connected to the printer electronics using alternative connection arrangements known to the person skilled in the art.

The printhead IC 2 has a plurality of through-silicon vias extending from its frontside and into the longitudinal recessed edge portion 6, which accommodates the TAB film 8. Each through-silicon via is filled with a conductor (e.g. copper) to define a through-silicon connector 14, which provides electrical connection to the TAB film 8. Each film contact 10 is connected to a foot or base 15 of the through-silicon connector 14 using a suitable connection e.g. solder ball 16.

The through-silicon connector 14 extends through a silicon substrate 20 of the printhead IC 2 and through the CMOS circuitry layers 113. The through-silicon connector 14 is insulated from the silicon substrate 20 by insulating sidewalls 21. The insulating sidewalls 21 may be formed from any suitable insulating material compatible with MEMS fabrication, such as amorphous silicon, polysilicon or silicon dioxide. The insulating sidewalls 21 may be monolayered or multilayered. For example, the insulating sidewalls 21 may comprise an outer Si or $SiO_2$ layer and an inner tantalum layer. The inner Ta layer acts as diffusion barrier so as to minimize diffusion of copper into the bulk silicon substrate. The Ta layer may also act as seed layer for electrodeposition of copper during fabrication of the through-silicon connectors 14.

As shown in FIG. 14, a head 22 of the through-silicon connector 14 meets with a contact pad 24 defined in a MEMS layer 26 of the printhead IC 2. The MEMS layer 26 is disposed on the CMOS circuitry layers 113 of the printhead IC 2 and comprises all the inkjet nozzle assemblies 101 formed by MEMS processing steps.

In the case of the Applicant's thermal bend-actuated printheads, such as those described in US 2008/0129793 (the contents of which are herein incorporated by reference), a conductive thermoelastic actuator 25 may define a roof of each nozzle chamber 101. Hence, the contact pad 24 may be formed at the same time as the thermoelastic actuator 25 during MEMS fabrication and, moreover, be formed of the same material. For example, the contact pad 24 may be formed from thermoelastic materials, such as vanadium-aluminium alloys, titanium nitride, titanium aluminium nitride etc.

However, it will appreciated that formation of the contact pad 24 may be incorporated into any step of MEMS fabrication and, moreover, may be comprised of any suitably conductive material e.g. copper, titanium, aluminium, titanium nitride, titanium aluminium nitride etc.

The contact pad 24 is connected to an upper layer of the CMOS circuitry 113 via copper conductor posts 30 extending from the contact pad towards the CMOS circuitry. Hence, the conductor posts 30 provide electrical connection is provided between the TAB film 8 and the CMOS circuitry 113.

Although the arrangement of contact pad 24 and connector posts 30 in FIG. 14 is conveniently compatible with the Applicant's MEMS fabrication process for forming thermal bend-actuated inkjet nozzles (as described in U.S. application Ser. No. 12/323,471, the contents of which are herein incorporated by reference), the present invention, of course, encompasses alternative arrangements which provide similar backside electrical connections to the CMOS circuitry 113 from the backside TAB film 8.

Figure 15:
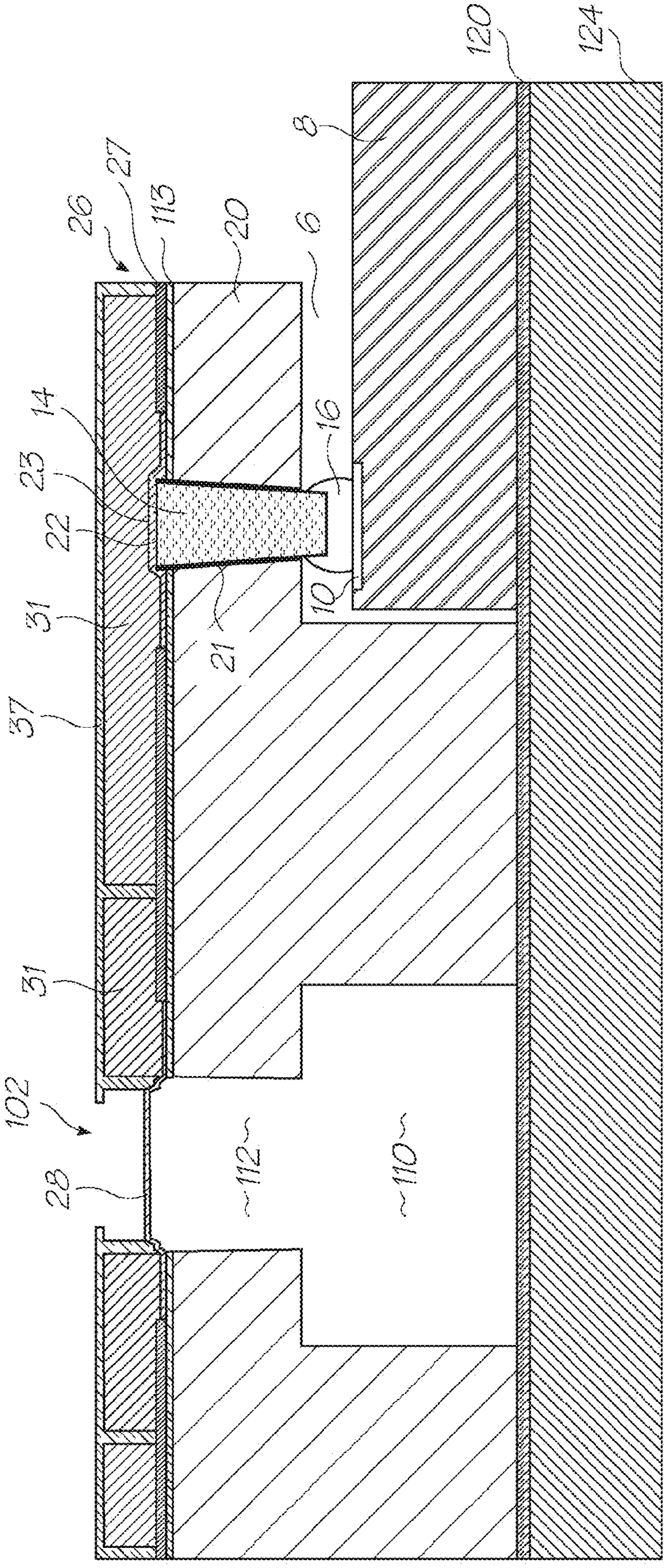
FIG. 15 is a schematic cross-section of an alternative printhead assembly according to the present invention.

For example, and referring now to FIG. 15, the through-silicon connectors 14 may terminate at a passivation layer 27 above the CMOS circuitry 113. An embedded contact pad 23 connects the through-silicon connector 14 with an upper CMOS layer by deposition of a suitably conductive material onto the head 22 of the through-silicon connector and the upper CMOS layer exposed through the passivation layer 27. Subsequent deposition of photoresist 31 and a roof layer 37 (e.g. silicon nitride, silicon oxide etc) during MEMS nozzle fabrication then provides a fully planar nozzle plate and ink ejection face for the printhead. Furthermore, the embedded contact pads 23 are fully sealed and encapsulated with the photoresist 31 beneath the roof layer 37. This alternative contact pad arrangement would be compatible with, for example, the Applicant's MEMS fabrication processes for forming thermal bubble-forming inkjet nozzle assemblies, as described in U.S. Pat. Nos. 6,755,509 and 7,303,930, the contents of which are herein incorporated by reference. The nozzle assembly shown in FIG. 15 is a thermal bubble-forming inkjet nozzle assembly comprising a suspended heater element 28 and nozzle opening 102, as described in U.S. Pat. No. 6,755,509. It will be readily apparent to the person skilled in the art that the embedded contact pad 23 and the suspended heater element 28 may be co-formed during MEMS fabrication by deposition of the heater element material and subsequent etching. Accordingly, the embedded contact pad 23 may be comprised of the same material as the heater element 36 e.g. titanium nitride, titanium aluminium nitride etc.

Returning now to FIG. 14, it should be noted that the ink ejection face of the printhead IC 2 is fully planar and coated with a layer of hydrophobic PDMS 48. PDMS coatings and their advantages are described in detail in US Publication No. 2008/0225082, the contents of which are herein incorporated by reference. As already mentioned, the planarity of the ink ejection face, including those parts of the face at the longitudinal edge region 4 of the printhead integrated circuit 2, provides significant advantages in terms of printhead maintenance and control of face flooding.

Although in FIGS. 14 and 15, the contact pad is shown schematically adjacent to the nozzles 102, it will be appreciated that the contacts pads 24 in the printhead IC 2 typically occupy similar positions to the bond pads 105 of the printhead IC 100 (FIG. 1), with a corresponding number of through-silicon connectors 14 extending into the silicon substrate 20. Nevertheless, it is an advantage of the present invention that the contact pads 24 need not be spatially distant from the inkjet nozzles 102 in the same way that is required for bond pads 105, which require sufficient surrounding space to allow wirebonding and wirebond encapsulation. Thus, backside TAB film connections enable more efficient use of silicon and potentially reduce the overall width of each IC or, alternatively, allow a greater number of nozzles 102 to be formed across the same width of IC. For example, whereas about 60-70% of the IC width is dedicated to inkjet nozzles 102 in the printhead IC 100, the present invention enables more than 80% of the IC width to be dedicated to inkjet nozzles. Given that silicon is one of the most expensive components in pagewidth inkjet printers, this is a significant advantage.

MEMS Fabrication Process for Printhead IC Configured for Backside Electrical Connection A MEMS fabrication process for the printhead IC 2 shown in FIG. 14 will now be described in detail. This MEMS fabrication process includes several modifications of the process described in U.S. application Ser. No. 12/323,471 so as to incorporate the features required for backside connection to the TAB film 8. Although the MEMS process is described in detail herein for illustrative purposes, it will be appreciated by the skilled person that similar modifications of any inkjet nozzle fabrication process would provide a printhead integrated circuit configured for backside electrical connection. Indeed, the Applicant has already alluded to a suitable MEMS fabrication process for fabricating the thermally-actuated printhead IC shown in FIG. 15. Hence, the present invention is not intended to be limited to the particular nozzle assemblies 101 described hereinbelow.

FIGS. 16 to 25 show a sequence of MEMS fabrication steps for forming the printhead IC 2 described in connection with FIG. 14. The completed printhead IC 2 comprises a plurality of nozzle assemblies 101 as well as features enabling backside connections to the CMOS circuitry 113.

The starting point for MEMS fabrication is a standard CMOS wafer comprising the silicon substrate 20 and CMOS circuitry 113 formed on a frontside surface of the wafer. At the end of the MEMS fabrication process, the wafer is diced into individual printhead integrated circuits (ICs) via etched dicing streets, which define the dimensions of each printhead IC fabricated from the wafer.

Although the present description refers to MEMS fabrication processes performed on the CMOS layer 113, it will of course be understood that the CMOS layer 113 may comprise multiple CMOS layers (e.g. 3 or 4 CMOS layers) and is usually passivated. The CMOS layer 113 may be passivated with, for example, a layer of silicon oxide or, more usually, a standard 'ONO' stack comprising a layer of silicon nitride sandwiched between two layers of silicon oxide. Hence, references herein to the CMOS layer 113 implicitly include a passivated CMOS layer, which typically comprises multiple layers of CMOS.

The following description focuses on fabrication steps for one nozzle assembly 101 and one through-silicon connector 14. However, it will of course be appreciated that corresponding steps are being performed simultaneously for all nozzle assemblies and all through-silicon connectors.

Figure 16:
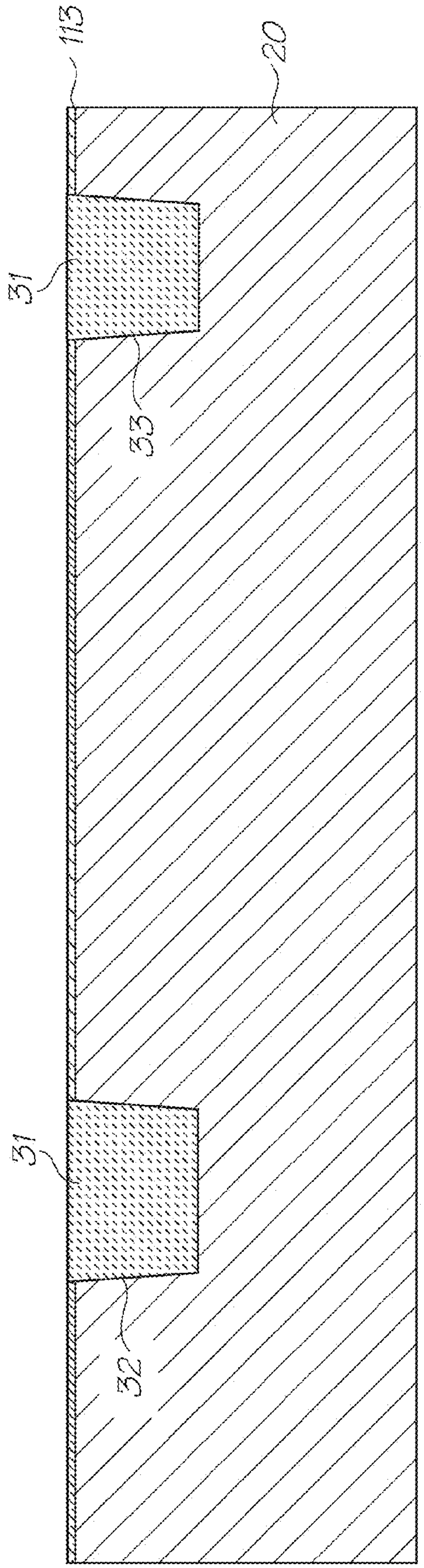
FIGS. 16 to 24 are schematic cross-sections of a wafer after a various stages of fabricating a printhead integrated circuit according to the present invention.

In a first sequence of steps shown in FIG. 16, a frontside inlet hole 32 is etched through the CMOS layer 113 and into the silicon substrate 20 of the CMOS wafer. At the same time, a frontside dicing street hole 33 is etched through the CMOS layer 113 and into the silicon substrate. Photoresist 31 is then spun onto the frontside of the wafer so as to plug the frontside inlet hole 32 and frontside dicing street hole 33. The wafer is then polished by chemical mechanical planarization (CMP) to provide the wafer shown in FIG. 16, having a planar frontside surface ready for subsequent MEMS steps.

Figure 17:
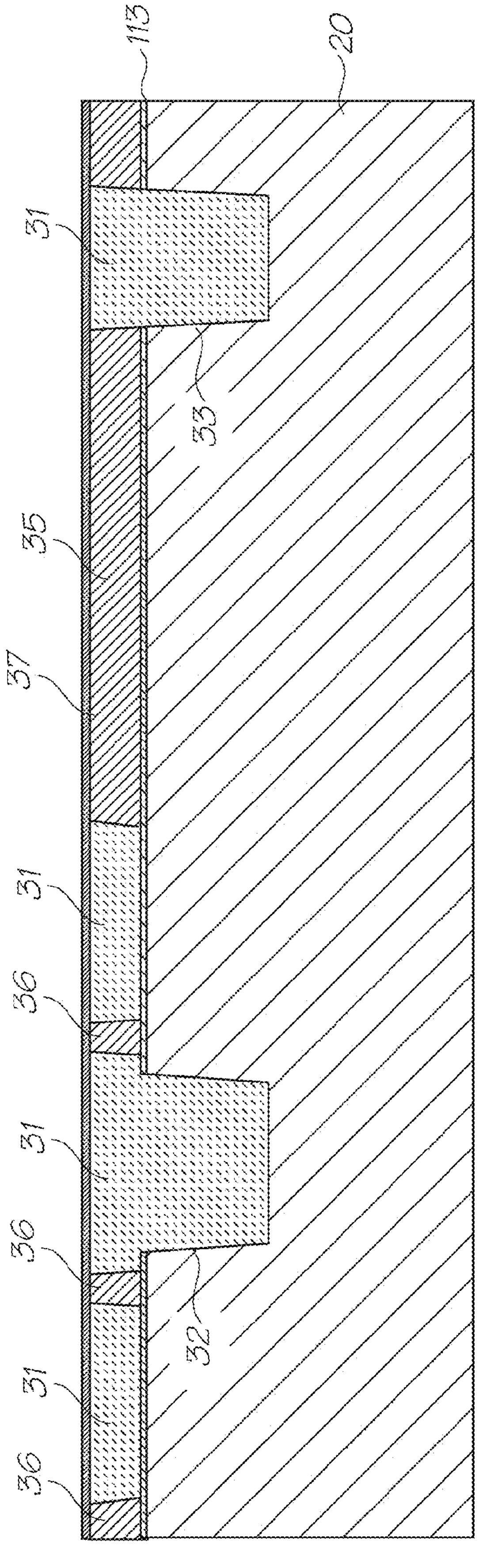

Referring to FIG. 17, in the next sequence of steps, an 8 micron layer of low-stress silicon oxide is deposited onto the CMOS layer 113 by plasma-enhanced chemical vapour deposition (PECVD). The depth of this silicon oxide layer 35 defines the depth of each nozzle chamber of the inkjet nozzle assemblies. After deposition of the $SiO_2$ layer 35, subsequent etching through the $SiO_2$ layer defines walls 36 for nozzle chambers and part of a frontside dicing street hole 32. A silicon etch chemistry is then employed to extend the frontside dicing street hole 33 and etch an ink inlet hole 32 into the silicon substrate 20. The resulting holes 32 and 33 are subsequently plugged with photoresist 31 by spinning on the photoresist and planarizing the wafer using CMP polishing. The photoresist 31 is a sacrificial material which acts as a scaffold for the subsequent deposition of roof material. It will be readily apparent that other suitable sacrificial materials (e.g. polyimide) may be used for this purpose.

The roof material (e.g silicon oxide, silicon nitride, or combinations thereof) is deposited onto the planarized $SiO_2$ layer 35 to define the frontside roof layer 37. The roof layer 37 will define a rigid planar nozzle plate in the completed printhead IC 2. FIG. 17 shows the wafer at end of this sequence of MEMS processing steps.

Figure 18:
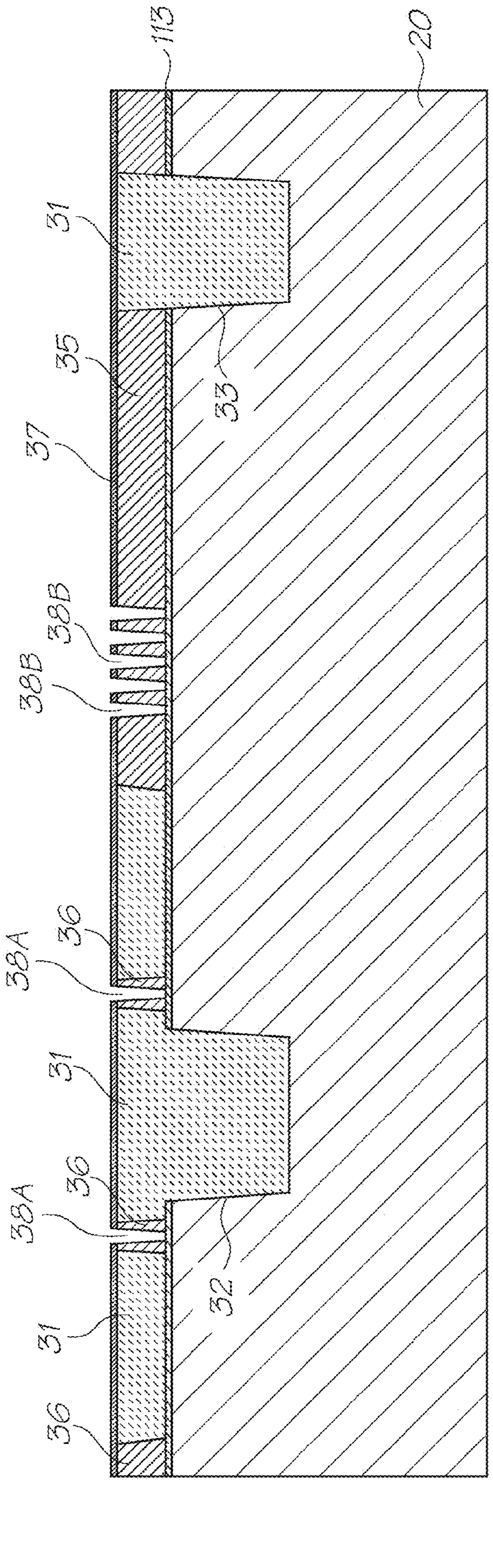
Figure 19:
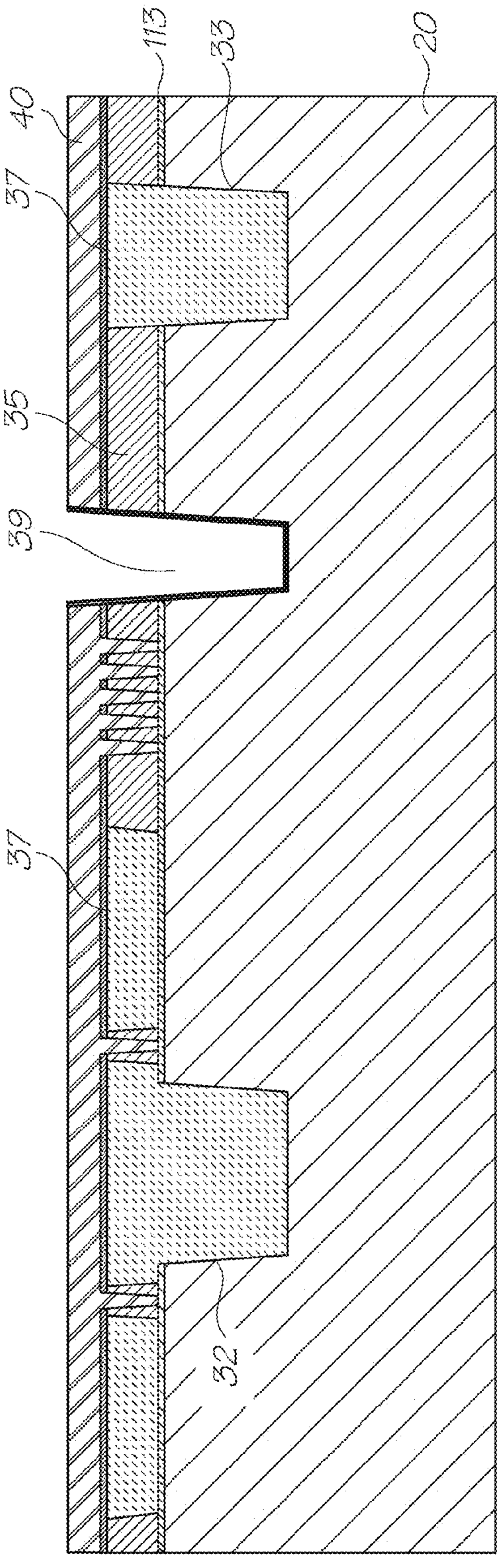

In the next stage, and referring now to FIG. 18, a plurality conductor post vias 38 are etched through the roof layer 37 and the $SiO_2$ layer 35 down to the CMOS layer 113. The conductor post vias 38A etched through the walls 36 will enable connection of nozzle actuators to the underlying CMOS 113. Meanwhile, the conductor post vias 38B will enable electrical connection between the contact pad 24 and the underlying CMOS 113.

Before filling the vias 38 with a conductive material, and in a modification of the process described in U.S. application Ser. No. 12/323,471, a through-silicon via 39 is defined in the next step by etching through the roof layer 37, the $SiO_2$ layer 35, the CMOS layer 113 and into the silicon substrate 20 (see FIG. 19). The through-silicon vias 39 are positioned so as to be spaced apart along a longitudinal edge region of each completed printhead IC 2. (The frontside dicing street hole 33 effectively defines the longitudinal edge of each printhead IC 2). Each via 39 is generally tapered towards the backside of the silicon substrate 20. The exact positioning of the vias 39 is determined by the positioning of film contacts 10 in the TAB film 8, which meet with the base of each via when the printhead IC is assembled and connected to the TAB film.

The through-silicon via etch is performed by patterning a mask layer of photoresist 40 and etching through the various layers. Of course, different etch chemistries may be required for etching through each of the various layers, although the same photoresist mask may be employed for each etch.

Each through-silicon via 39 typically has a depth through the silicon substrate 20 corresponding to the depth of the plugged frontside ink inlet 32 (typically about 20 microns). However, each via 39 may be made deeper than the frontside ink inlet 32 depending on the thickness of the TAB film 8.

Figure 20:
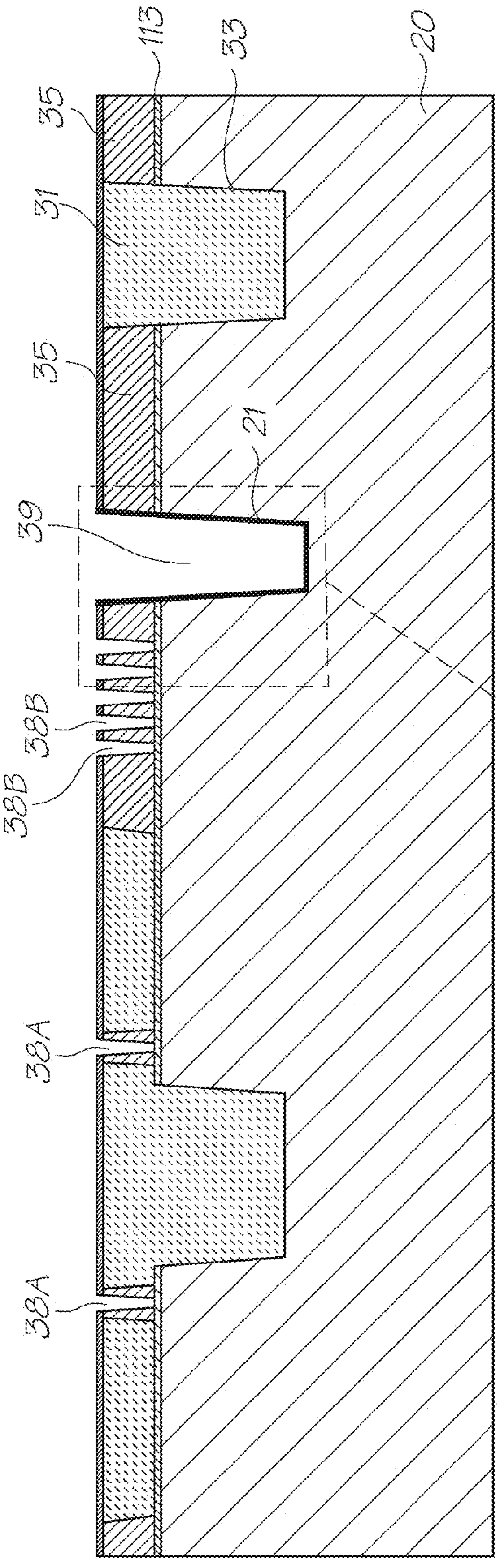
Figure 21:
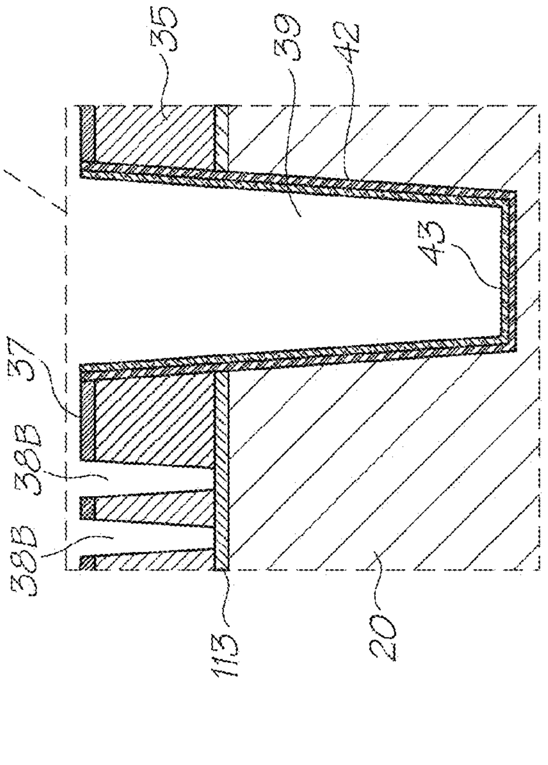

In the next sequence of steps, and referring to FIGS. 20 and 21, the through-silicon via 39 is provided with insulating walls 21, which isolate the via from the silicon substrate 20. The insulating walls 21 comprise an insulating film 42 and a diffusion barrier 43. The diffusion barrier 43 minimizes diffusion of copper into the bulk silicon substrate 20 when each via 39 is filled with copper. The insulating film 42 and the diffusion barrier 43 are formed by sequential deposition steps, optionally using the mask layer 40 for selective deposition of each layer into the via 39.

The insulating film 42 may be comprised of any suitable insulating material, such as amorphous silicon, polysilicon, silicon oxide etc. The diffusion barrier 43 is typically a tantalum film.

Figure 22:
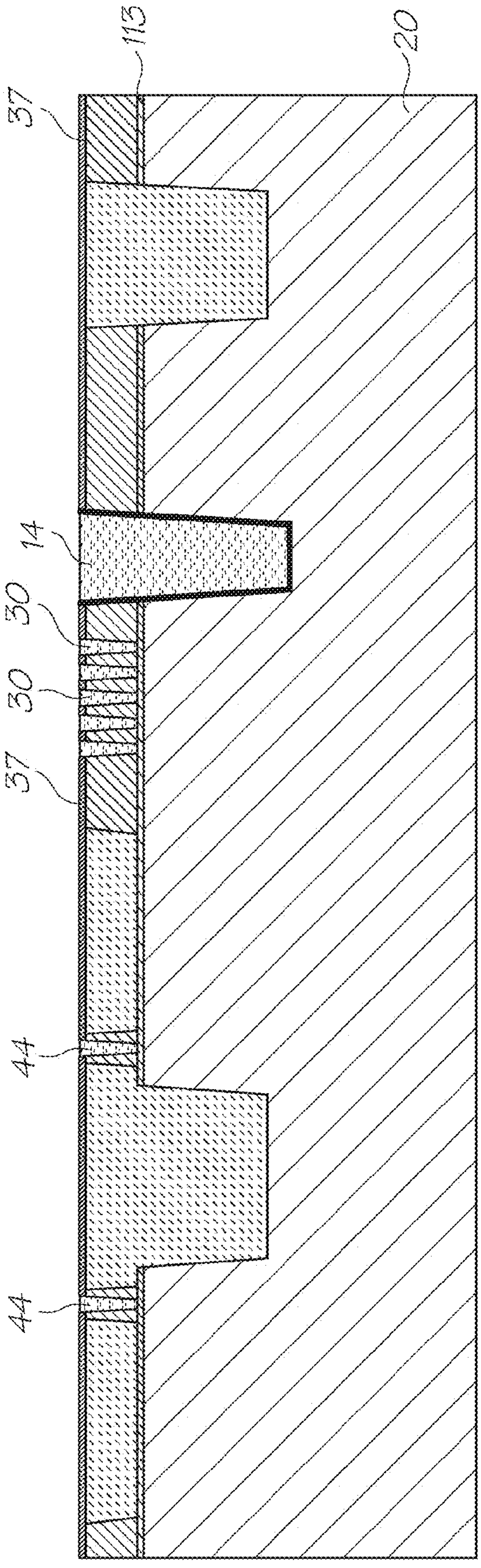

Referring next to FIG. 22, the conductor post vias 38 and the through-silicon vias 39 are filled simultaneously with a highly conductive metal, such as copper, using electroless plating. The copper deposition step simultaneously forms nozzle conductor posts 44, contact pad conductor posts 30 and the through-silicon connector 14. Appropriate sizing of the diameters of the vias 38 and 39 may be required to ensure simultaneous copper plating during this step. After the copper plating step, the deposited copper is subjected to CMP, stopping on the roof layer 37 to provide a planar structure. It can be seen that the conductor posts 30 and 44, formed during the electroless copper plating, meet with the CMOS layer 113 to provide a linear conductive path from the CMOS layer up to the roof layer 37.

Figure 23:
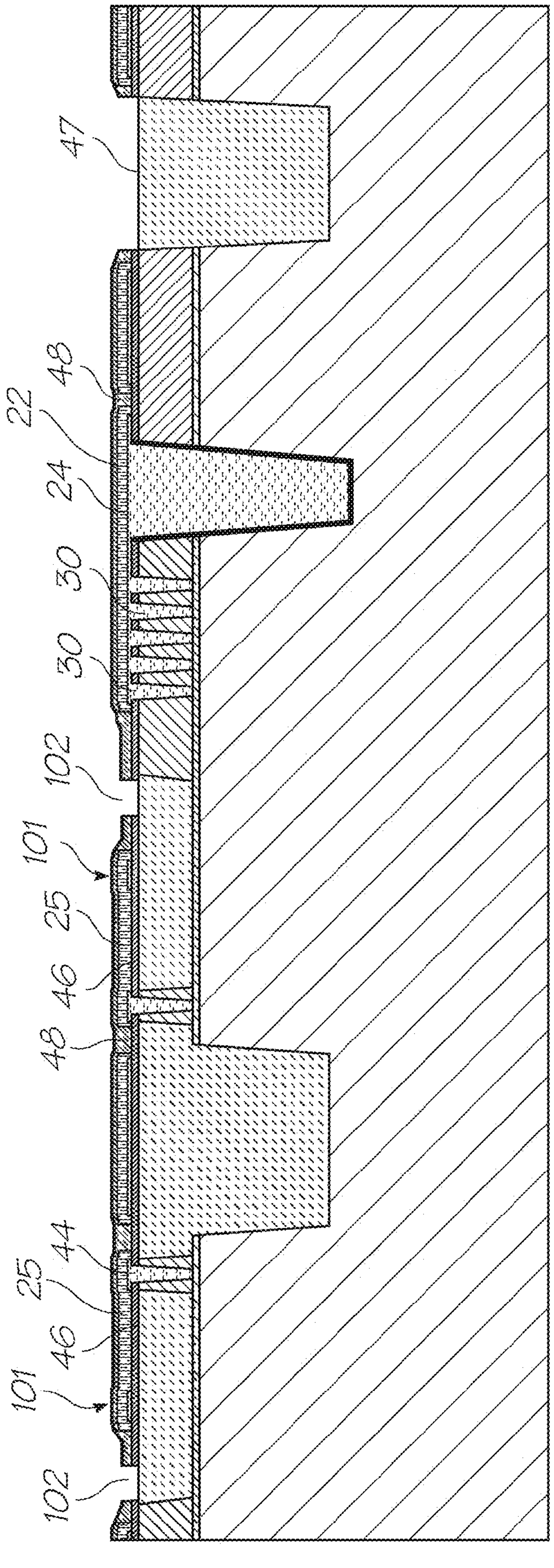

In the next sequence of steps, and referring to FIG. 23, a thermoelastic material is deposited over the roof layer 37 and then etched to define the thermoelastic beam member 25 for each nozzle assembly 101 as well as the contact pad 24 overlaying a head of the through-silicon connector 14.

By virtue of being fused to thermoelastic beam members 25, parts of the $SiO_2$ roof layer 37 function as a lower passive beam member 46 of a mechanical thermal bend actuator. Therefore, each nozzle assembly 101 comprises a thermal bend actuator comprising an upper thermoelastic beam 25 connected to the CMOS 113, and a lower passive beam 46. These types of thermal bend actuator are described in more detail in, for example, US Publication No. 2008/309729, the contents of which are herein incorporated by reference.

The thermoelastic active beam member 25 may be comprised of any suitable thermoelastic material, such as titanium nitride, titanium aluminium nitride and aluminium alloys. As explained in the Applicant's earlier US Publication No. 2008/129793, the contents of which are herein incorporated by reference, vanadium-aluminium alloys are a preferred material, because they combine the advantageous properties of high thermal expansion, low density and high Young's modulus.

As mentioned above, the thermoelastic material is also used to define the contact pad 24. The contact pad 24 extends between heads of the conductor posts 30 and the head 22 of the through-silicon connector 14. Hence, the contact pad 24 electrically connects the through-silicon connector 14 with each conductor post 30 and the underlying CMOS layer 113.

Still referring to FIG. 23, after deposition of the thermoelastic material and etching to define the thermal bend actuators and contact pads 24, the final frontside MEMS fabrication steps comprise etching of the nozzle openings 102 with simultaneous etching of a frontside street opening 47 and deposition of a PDMS coating 48 over the entire roof layer 37 so as to hydrophobize the frontside face and provide elastic mechanical seals for each thermal bend actuator. The use of PDMS coatings was described extensively in our earlier U.S. application Ser. Nos. 11/685,084 and 11/740,925, the contents of which are incorporated herein by reference.

Figure 24:
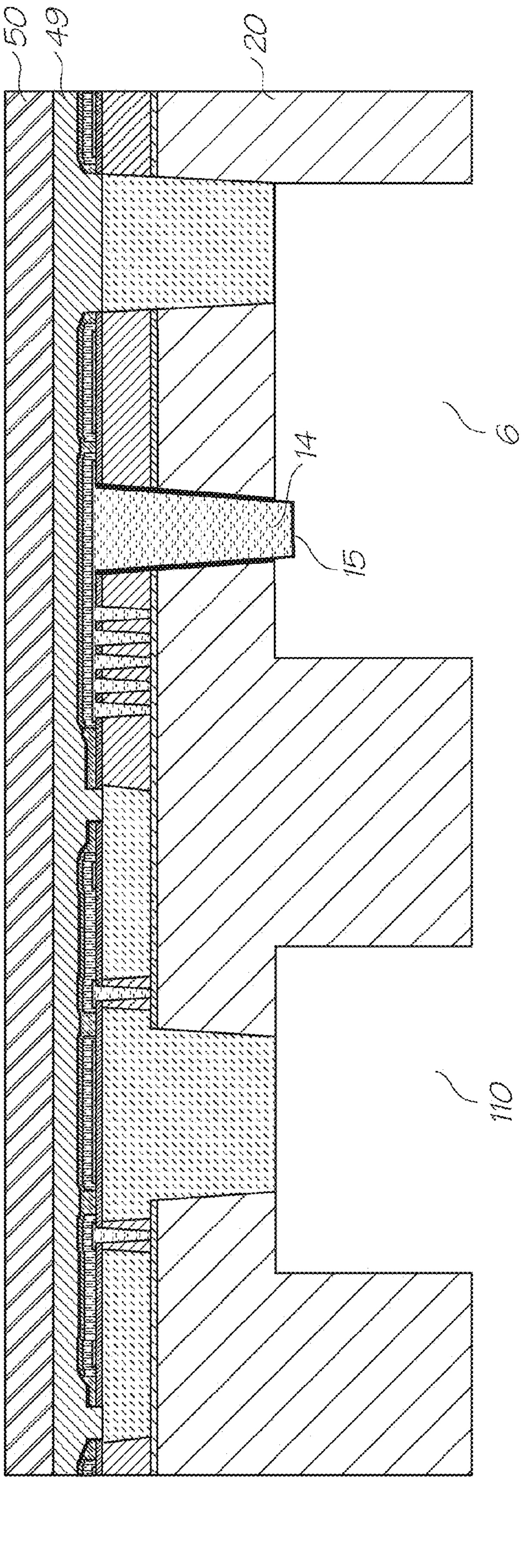

Referring now to FIG. 24, the entire frontside of the wafer is coated with a relatively thick layer of photoresist 49, which protects the frontside MEMS structures and enables the wafer to be attached to a handle wafer 50 for backside MEMS processing. Backside etching defines the ink supply channel 110 and the recessed portion 6 into which extends which the foot 15 of the through-silicon connector 14. Part of the insulating film 42 is removed when the foot 15 of the through-silicon connector 14 is exposed by the backside etch. The backside etch also enables singulation of individual printhead ICs by etching down to the plugged frontside dicing street hole 33.

Figure 25:
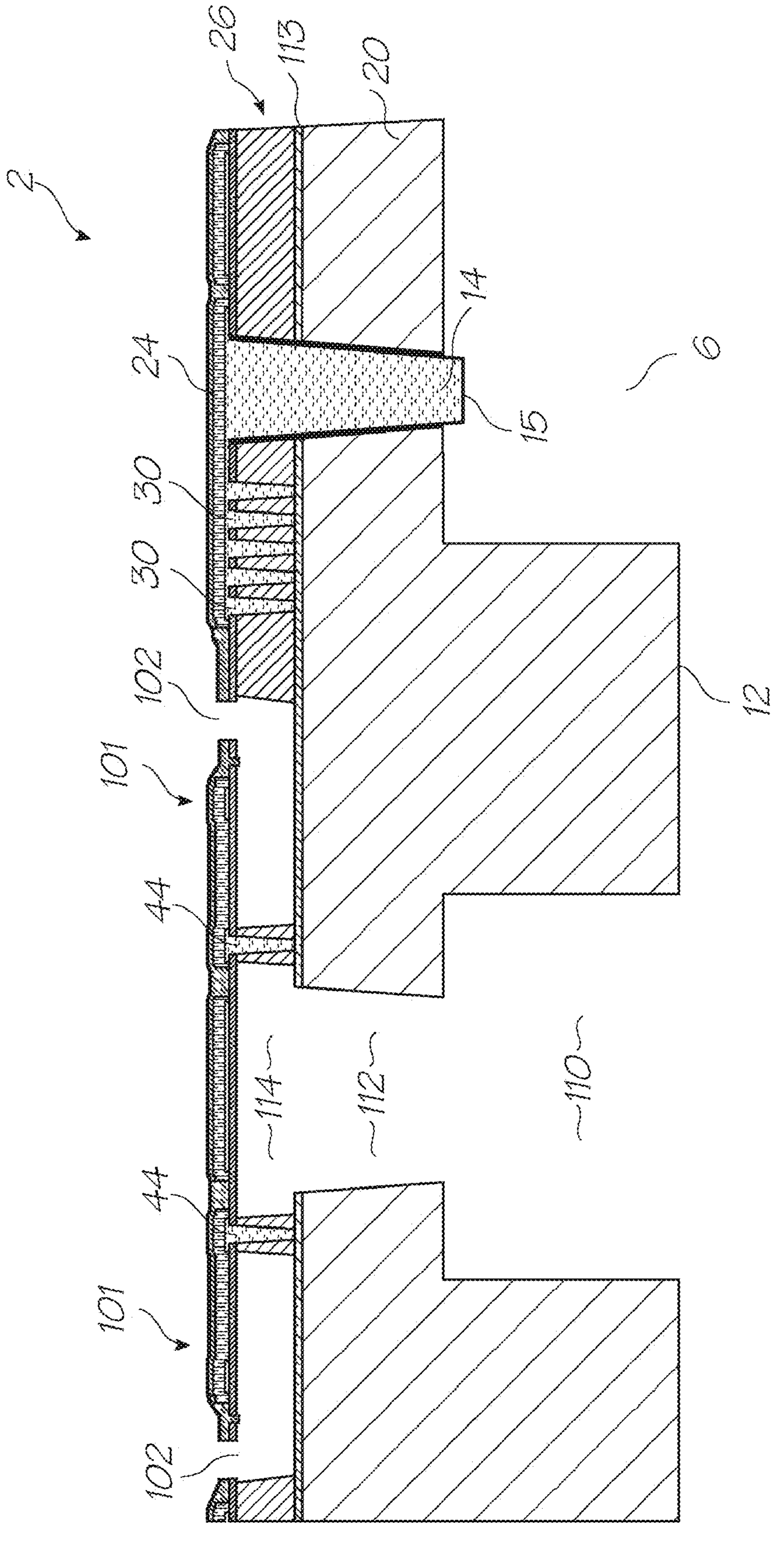
FIG. 25 is a schematic cross-section of a printhead integrated circuit according to the present invention.

Final oxidative removal ('ashing') of the protective photoresist 49 results in singulation of individual printhead ICs 2 and formation of fluid connections between the backside and the nozzle assemblies 101. The resultant printhead IC 2 shown in FIG. 25 is now ready for connection to the TAB film 8 via solder joints 16 to the through-silicon connectors 14. Subsequent bonding of the resulting printhead IC/TAB film assembly to the ink supply manifold provides the printhead assembly 60 shown in FIG. 14.

The present invention has been described with reference to a preferred embodiment and number of specific alternative embodiments. However, it will be appreciated by those skilled in the relevant fields that a number of other embodiments, differing from those specifically described, will also fall within the spirit and scope of the present invention. Accordingly, it will be understood that the invention is not intended to be limited to the specific embodiments described in the present specification, including documents incorporated by cross-reference as appropriate. The scope of the invention is only limited by the attached claims.

The invention claimed is:

1. A method of fabricating a printhead integrated circuit configured for backside electrical connections, said method comprising the steps of:

providing a wafer comprising a plurality of partially-fabricated nozzle assemblies on a frontside of the wafer and one or more through-silicon connectors extending from said frontside towards a backside of said wafer;

depositing a conductive layer on said frontside of said wafer and etching said conductive layer so as to form, concomitantly, an actuator for each nozzle assembly and a frontside contact pad over a head of each through-silicon connector, said frontside contact pad connecting said through-silicon connector to drive circuitry in said wafer;

performing further MEMS processing steps to complete formation of said nozzle assemblies, ink supply channels for said nozzle assemblies and said through-silicon connectors; and dividing said wafer into a plurality of individual printhead integrated circuits, each printhead integrated circuit being configured for backside-connection to said drive circuitry via said through-silicon connectors and said contact pads.

2. The method of claim 1, wherein said conductive material is selected from the group consisting of: titanium nitride, titanium aluminium nitride, titanium, aluminium, and vanadium-aluminium alloy.

3. The method of claim 1, wherein said actuator is selected from the group consisting of: a thermal bubble-forming actuator and a thermal bend actuator.

4. The method of claim 1, wherein said further MEMS processing steps comprise depositing a material onto said contact pad so as to seal or encapsulate said contact pad.

5. The method of claim 1, wherein a CMOS layer comprises said drive circuitry, and said nozzle assemblies are disposed in a MEMS layer formed on said CMOS layer.

6. The method of claim 1, wherein said further MEMS processing steps comprise oxidatively removing sacrificial material.

7. The method of claim 1, wherein said further MEMS processing steps comprise coating a frontside face with a hydrophobic polymer layer.

8. The method of claim 7, wherein said hydrophobic polymer layer is comprised of PDMS.

9. The method of claim 1, wherein said further MEMS processing steps comprise etching a backside of said wafer so as to define said ink supply channels and a backside recessed portion for each printhead integrated circuit.

10. The method of claim 9, wherein said ink supply channels and said backside recessed portion have a same depth.

11. The method of claim 9, wherein said backside etching exposes a foot of each through-silicon connector in said backside recessed portion, each foot comprising an integrated circuit contact.

12. The method of claim 9, wherein said through-silicon connectors are positioned along a longitudinal edge region of each printhead integrated circuit, and said backside recessed portion extends along said longitudinal edge region.

13. The method claim 11, wherein said integrated circuit contacts are positioned for connection to corresponding contacts of a TAB film.

14. The method of claim 1, wherein one or more conductor posts extend linearly between said contact pad and said CMOS layer and/or between said actuator and said CMOS layer.

15. The method of claim 14, wherein said conductor posts are formed prior to deposition of said conductive layer.

16. The method of claim 14, wherein said conductor posts are formed concomitantly with said through-silicon connectors.

17. The method of claim 16, wherein said conductor posts and said through-silicon connectors are formed by deposition of a conductive material into predefined vias.

18. The method of claim 17, wherein said conductive material is deposited by an electroless plating process.

19. The method of claim 17, wherein each of said predefined vias has a diameter proportionate with a depth such that said all said vias are filled evenly by said deposition.

20. The method of claim 17, wherein said conductive material is copper.

* * * * *